US012713755B2

(12) United States Patent
Jang et al.

(10) Patent No.: US 12,713,755 B2
(45) Date of Patent: Aug. 18, 2026

(54) LED DISPLAY APPARATUS

(71) Applicant: SEOUL VIOSYS CO., LTD., Ansan-si (KR)

(72) Inventors: Jong Min Jang, Ansan-si (KR); Chang Yeon Kim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 18/227,269

(22) Filed: Jul. 27, 2023

(65) Prior Publication Data

US 2023/0369385 A1 Nov. 16, 2023

Related U.S. Application Data

(63) Continuation of application No. 17/075,636, filed on Oct. 20, 2020, now Pat. No. 11,810,944.
(Continued)

(51) Int. Cl.
*H10H 29/14* (2025.01)
*H10H 20/831* (2025.01)
(Continued)

(52) U.S. Cl.
CPC ...... *H10H 29/142* (2025.01); *H10H 20/8312* (2025.01); *H10H 20/854* (2025.01); *H10H 20/857* (2025.01)

(58) Field of Classification Search
CPC ............. H10H 29/142; H10H 20/8312; H10H 20/854; H10H 20/857; H10H 29/34; H10H 29/853; H10H 29/962; H10H 20/85; H10H 20/813; H10H 20/819; H10H 20/8314; H10H 20/84; H10H 20/8506; H10H 20/853; H10H 20/856; H10W 90/00; H10D 86/40
See application file for complete search history.

(56) References Cited

U.S. PATENT DOCUMENTS 7,977,688 B2 7/2011 Kim
10,170,666 B2 1/2019 Cha et al.
(Continued)

FOREIGN PATENT DOCUMENTS

JP 2002-16312 A 1/2002
JP 2004-363343 12/2004
(Continued)

OTHER PUBLICATIONS

Extended European Search Report dated Sep. 6, 2023, in European Patent Application No. 20879476.8.
(Continued)

*Primary Examiner* — Su C Kim
(74) *Attorney, Agent, or Firm* — Oblon, McClelland, Maier & Neustadt, L.L.P.

(57) ABSTRACT

A display apparatus including a display substrate, a plurality of light emitting devices disposed on the display substrate, at least one of the light emitting devices including a first LED sub-unit, a second LED sub-unit disposed on the first LED sub-unit, and a third LED sub-unit disposed on the second LED sub-unit, and a molding layer covering side surfaces of the light emitting devices and exposing upper surfaces thereof, in which the third LED sub-unit is disposed closer to an upper surface of the light emitting device than the first LED sub-unit.

19 Claims, 37 Drawing Sheets

Related U.S. Application Data

(60) Provisional application No. 62/924,737, filed on Oct. 23, 2019.

(51) Int. Cl.
*H10H 20/854* (2025.01)
*H10H 20/857* (2025.01)

(56) References Cited

U.S. PATENT DOCUMENTS

2003/0047742 A1 3/2003 Hen
2007/0170444 A1* 7/2007 Cao ........................ H01L 33/382 257/E33.012
2008/0251799 A1* 10/2008 Ikezawa .............. H01L 25/0756 257/89
2009/0283787 A1* 11/2009 Donofrio ............. H10H 20/835 257/E33.068
2011/0294244 A1* 12/2011 Hattori ................... H10D 86/60 438/34
2014/0131760 A1 5/2014 Chen et al.
2014/0284633 A1 9/2014 Tsay et al.
2015/0318440 A1* 11/2015 Ito ........................... H01L 33/22 438/29
2015/0325555 A1* 11/2015 Hashimoto ......... H01L 25/0756 257/89
2017/0018679 A1* 1/2017 Lee ........................ H04B 10/43
2017/0288093 A1 10/2017 Cha et al.
2019/0088820 A1 3/2019 Danesh et al.
2019/0097088 A1* 3/2019 Huppmann ............. H01L 24/00
2019/0164944 A1 5/2019 Chae et al.
2019/0165207 A1 5/2019 Kim et al.
2019/0189596 A1 6/2019 Chae et al.
2019/0189681 A1 6/2019 Chae et al.
2019/0273187 A1* 9/2019 Yoon ....................... H01L 33/46
2019/0333968 A1 10/2019 Yamada et al.

FOREIGN PATENT DOCUMENTS

JP 2006-216933 A 8/2006
JP 2007-227820 A 9/2007
JP 2014-507804 A 3/2014
JP 2017-55038 3/2017
KR 10-2006-0080829 A 7/2006
KR 10-2010-0016901 2/2010
KR 10-1100579 1/2012
KR 10-2017-0115142 10/2017

OTHER PUBLICATIONS

International Search Report mailed Feb. 3, 2021, in International Application No. PCT/KR2020/014397.
Non-Final Office Action dated Oct. 6, 2022, in U.S. Appl. No. 17/075,636.
Final Office Action dated Mar. 21, 2023, in U.S. Appl. No. 17/075,636.
Notice of Allowance dated Jul. 18, 2023, in U.S. Appl. No. 17/075,636.
Japanese Office Action issued May 7, 2024 in Japanese Patent Application No. 2022-524054, 5 pages.
Office Action dated Feb. 2, 2025, issued in counterpart KR Application No. 10-2022-7004589, with English Translation. (17 pages).
Office Action issued Oct. 7, 2025 in Japanese Patent Application No. 2024-163598, 3 pages.
Brazilian Office Action Oct. 28, 2025 in corresponding Brazilian Patent Application No. BR112022007494-8, with English Translation. 7 pages.

* cited by examiner

LED DISPLAY APPARATUS

CROSS REFERENCE TO RELATED APPLICATION

This application is a Continuation of U.S. patent application Ser. No. 17/075,636, filed on Oct. 20, 2020, which claims priority from and the benefit of U.S. Provisional Patent Application No. 62/924,737, filed on Oct. 23, 2019, each of which is hereby incorporated by reference for all purposes as if fully set forth herein.

BACKGROUND

Field

Exemplary embodiments of the invention relate generally to a display apparatus, and, more specifically, to an LED display apparatus.

Discussion of the Background

As an inorganic light source, light emitting diodes have been used in various technical fields including displays, vehicular lamps, general lighting, and the like. With various advantages of light emitting diodes over conventional light sources, such as longer lifespan, lower power consumption, and rapid response, light emitting diodes have been replacing conventional light sources.

Light emitting diodes have been used as backlight light sources in display apparatuses. However, LED displays that directly display images using the light emitting diodes have been recently developed.

In general, a display apparatus realizes various colors through mixture of blue, green, and red light. In order to display various images, the display apparatus includes a plurality of pixels, each including sub-pixels that correspond to blue, green, and red light, respectively. In this manner, a color of a certain pixel is determined based on the colors of the sub-pixels so that images can be displayed through combination of such pixels.

Since LEDs can emit various colors depending upon materials thereof, a display apparatus may be provided by arranging individual LED chips emitting blue, green, and red light on a two-dimensional plane. However, when one LED chip is arranged in each sub-pixel, the number of LED chips may be increased, which may require excessive time for a mounting process during manufacture.

Since the sub-pixels are arranged on the two-dimensional plane in the display apparatus, a relatively large area is occupied by one pixel that includes the sub-pixels for blue, green, and red light. In this case, when an area of each sub-pixel is reduced to arrange the sub-pixels in a restricted area, luminous area of the sub-pixels may be reduced, thereby deteriorating the brightness of the pixels.

Meanwhile, a display apparatus that realizes various colors needs to consistently provide high-quality white light. Conventional TVs use an RGB mixing ratio of 3:6:1 to realize the standard white light of D65. More particularly, luminance intensity of red is higher than that of blue, and luminance intensity of green is relatively the highest. However, since LED chips that are currently used have relatively very high luminance intensity of blue LED compared to that of other LEDs, it is difficult to match the RGB mixing ratio in the display apparatus using LED chips.

When viewing angles of blue, green, and red light emitted within one pixel are large, interference of light between adjacent pixels may occur, and further, it is difficult to realize a clear image quality. Moreover, when the viewing angles of blue, green, and red light emitted in one pixel are different from each other, different images with different RGB mixing ratios are implemented depending on viewing angles.

The above information disclosed in this Background section is only for understanding of the background of the inventive concepts, and, therefore, it may contain information that does not constitute prior art.

SUMMARY

Display devices constructed according to exemplary embodiments of the invention are capable of increasing an area of each sub-pixel in a restricted pixel area.

Exemplary embodiments also provide a display apparatus that is capable of reducing a mounting process time.

Exemplary embodiments still provide a display apparatus that is capable of easily controlling an RGB mixing ratio.

Exemplary embodiments yet provide a display apparatus that is capable of reducing viewing angles of various colors of light emitted within one pixel.

Exemplary embodiments further provide a display apparatus that is capable of unifying viewing angles of various colors of light emitted within one pixel.

Additional features of the inventive concepts will be set forth in the description which follows, and in part will be apparent from the description, or may be learned by practice of the inventive concepts.

A display apparatus according to an exemplary embodiment includes a display substrate, a plurality of light emitting devices disposed on the display substrate, at least one of the light emitting devices including a first LED sub-unit, a second LED sub-unit disposed on the first LED sub-unit, and a third LED sub-unit disposed on the second LED sub-unit, and a molding layer covering side surfaces of the light emitting devices and exposing upper surfaces thereof, in which the third LED sub-unit is disposed closer to an upper surface of the light emitting device than the first LED sub-unit.

The molding layer may be configured to block light by reflecting or absorbing light emitted from the light emitting device.

The first, second, and third LED sub-units may be configured to emit red light, blue light, and green light, respectively.

The first LED sub-unit may include a first light emitting stack, the second LED sub-unit may include a second light emitting stack, the third LED sub-unit may include a third light emitting stack, and each of the light emitting stacks may include a first conductivity type semiconductor layer, an active layer, and a second conductivity type semiconductor layer.

An upper surface of the molding layer may be substantially flush with an upper surface of the first conductivity type semiconductor layer of the third light emitting stack.

The at least one of the light emitting devices may further include a substrate disposed on the third LED sub-unit, and the upper surface of the molding layer may be substantially flush with an upper surface of the substrate.

The at least one of the light emitting devices may further include a first bonding layer interposed between the first LED sub-unit and the second LED sub-unit, and a second bonding layer interposed between the second LED sub-unit and the third LED sub-unit.

The at least one of the light emitting devices may further include a first connection electrode electrically connected to the first LED sub-unit, a second connection electrode electrically connected to the second LED sub-unit, a third connection electrode electrically connected to the third LED sub-unit, and a fourth connection electrode electrically connected to the first, second, and third sub-units in common.

The at least one of the light emitting devices may further include a protection layer surrounding at least portions of the first, second, third, and fourth connection electrodes.

The protection layer may include an epoxy molding compound or polyimide film, and a lower surface of the protection layer may be substantially flush with lower surfaces of the first, second, third, and fourth connection electrodes.

The display apparatus may further include a circuit board interposed between the display substrate and the light emitting device, in which the first, second, third, and fourth connection electrodes may be bonded to the circuit board, and the molding layer may be disposed on the circuit board.

The lower surfaces of the first, second, third, and fourth connection electrodes may have a greater contact area than the upper surfaces thereof.

The first connection electrode, the second connection electrode, and the third connection electrode may be electrically connected to the second conductivity type semiconductor layers of the first light emitting stack, the second light emitting stack, and the third light emitting stack, respectively, and the fourth connection electrode may be commonly electrically connected to the first conductivity type semiconductor layers of the first, second, and third light emitting stacks.

The first conductivity type semiconductor layer of the first light emitting stack may include a recessed portion, and the first LED sub-unit may further include an upper contact electrode disposed in the recessed portion and in ohmic contact with the first conductivity type semiconductor layer of the first light emitting stack.

The at least one of the light emitting devices may further include first, second, and third lower contact electrodes contacting the second conductivity type semiconductor layers of the first, second, and third light emitting stacks, respectively, and a first insulation layer having first, second, and third contact holes partially exposing the first, second, and third lower contact electrodes, in which the first insulation layer may have sub-contact holes disposed on the first conductivity type semiconductor layers of the first, second, and third light emitting stacks, and the sub-contact holes may be spaced apart from one another.

The at least one of the light emitting devices may further include first, second, and third pads overlapping with the first, second, and third contact holes, and a fourth pad overlapping with the sub-contact holes, and the first, second, third, and fourth connection electrodes may be electrically connected to the first, second, third, and fourth pads, respectively.

A display apparatus according to another exemplary embodiment includes a display substrate, a plurality of light emitting devices disposed on the display substrate, at least one of the light emitting devices including a first LED stack configured to emit red light, a second LED stack disposed on the first LED stack and configured to emit blue light, and a third LED stack disposed on the second LED stack and configured to emit green light, the third LED stack being disposed closer to an upper surface of the light emitting device, and a molding layer covering side surfaces of the light emitting devices and exposing upper surfaces thereof, in which the molding layer is configured to block light emitted from the first, second, and third LED stacks.

The at least one of the light emitting devices may further include a substrate disposed on the third LED stack, and the molding layer may cover a side surface of the substrate and exposes an upper surface of the substrate.

The at least one of the light emitting devices may further include first, second, third, and fourth connection electrodes, each of the first, second, and third LED stacks may include a first conductivity type semiconductor layer and a second conductivity type semiconductor layer, the first, second, and third connection electrodes may be electrically connected to the first conductivity type semiconductor layers of the first, second, and third LED stacks, and the fourth connection electrode may be electrically connected to second conductivity type semiconductor layers of the first, second, and third LED stacks in common.

The at least one of the light emitting devices may further include a protection layer at least partially covering side surfaces of the connection electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 14, 15, and 16A are cross-sectional views schematically illustrating a process of manufacturing a light emitting package according to an exemplary embodiment.

DETAILED DESCRIPTION

Figure 1A:
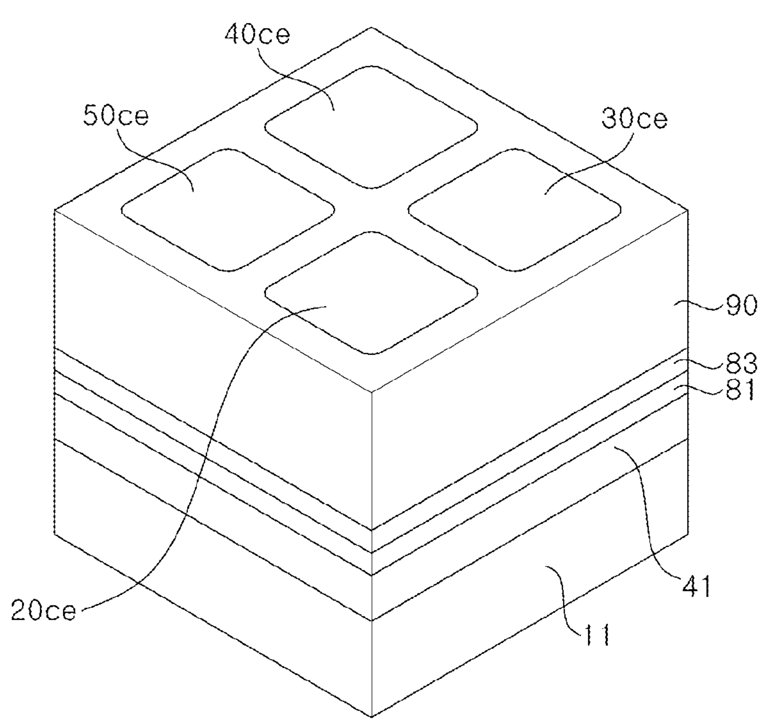
FIG. 1A shows a schematic perspective view of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be described in detail with reference to the accompanying drawings. Hereinafter, a light emitting stack structure, a light emitting device, or a light emitting package may include micro-LEDs, which have a light emitting area of 10000 $\mu m^2$ or less as known in the art. In other exemplary embodiments, the micro-LED may have a light emitting area of 4000 $\mu m^2$ or less, and further, 2500 $\mu m^2$ or less.

Figure 1B:
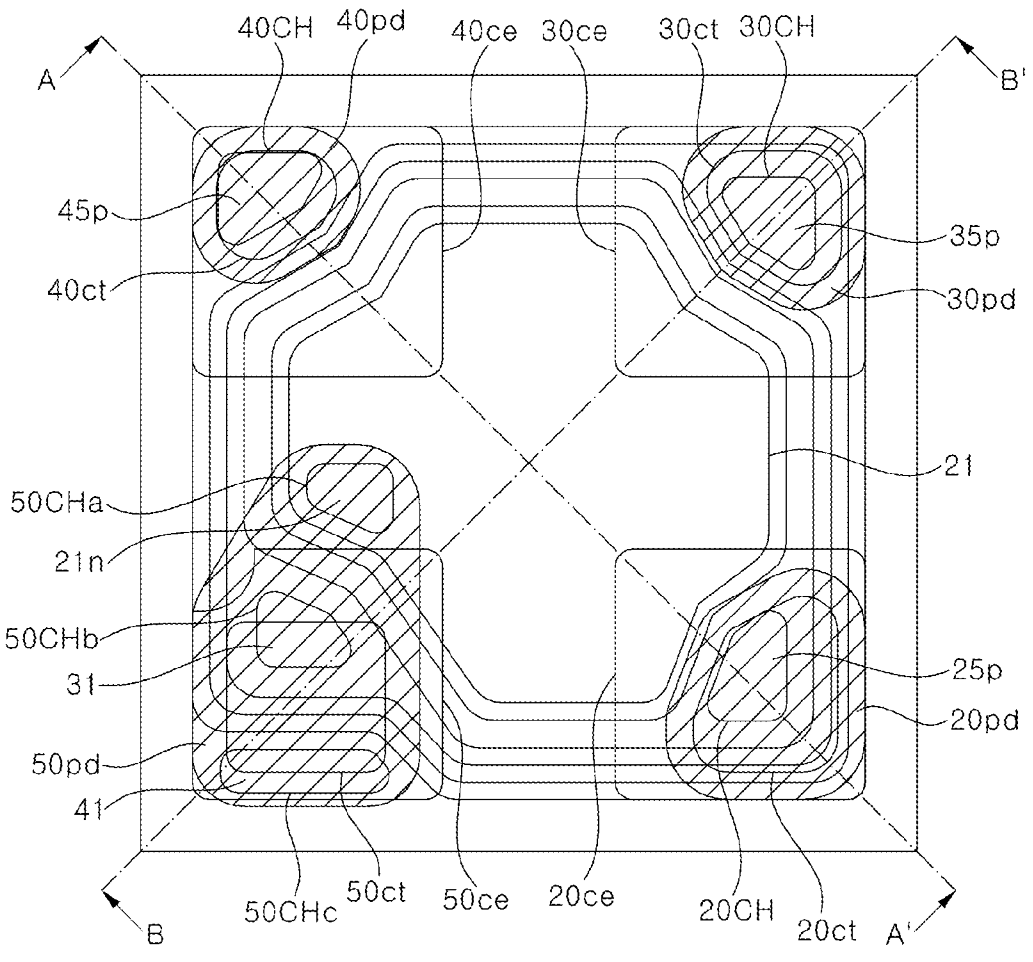
FIG. 1B is a schematic plan view of the light emitting device of FIG. 1A.
Figure 1C:
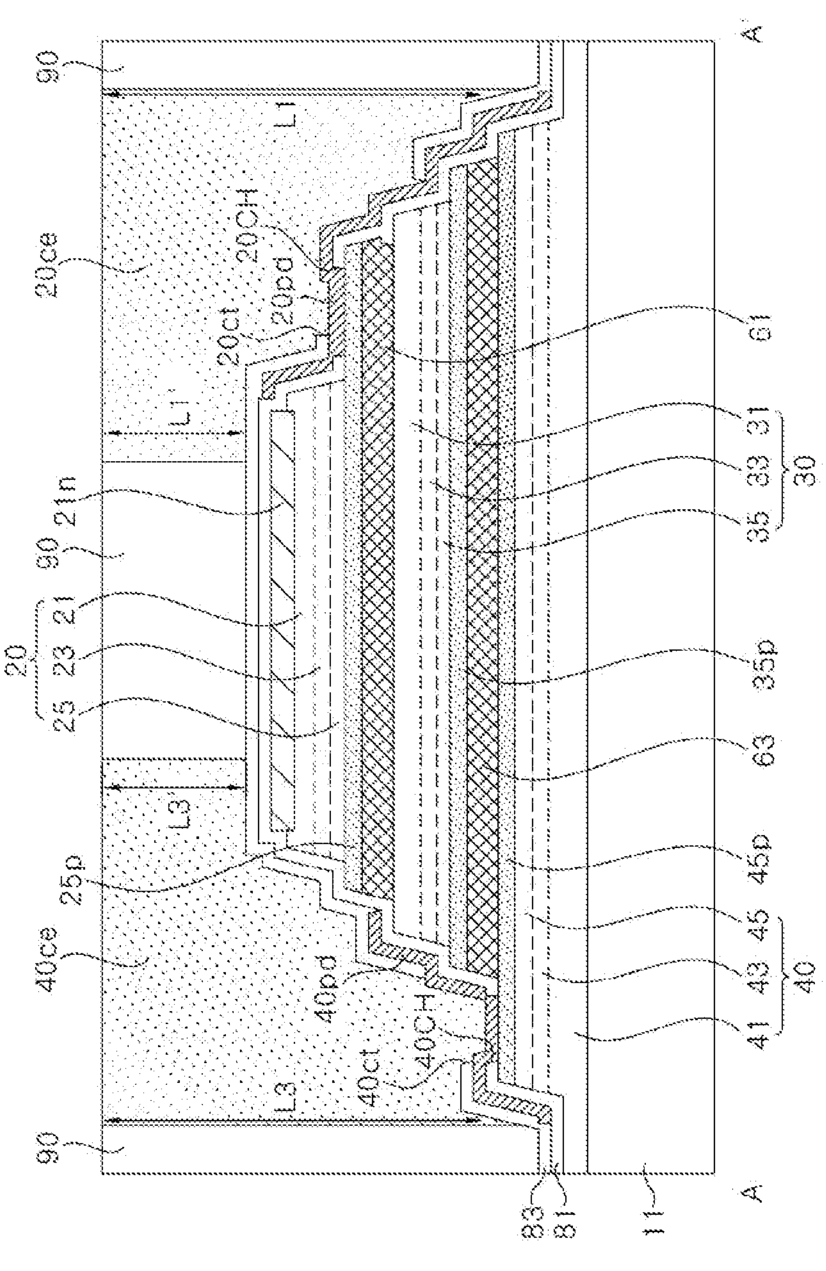
FIG. 1C and FIG. 1D are schematic cross-sectional views taken along lines A-A' and B-B' of FIG. 1B, respectively.
Figure 1D:
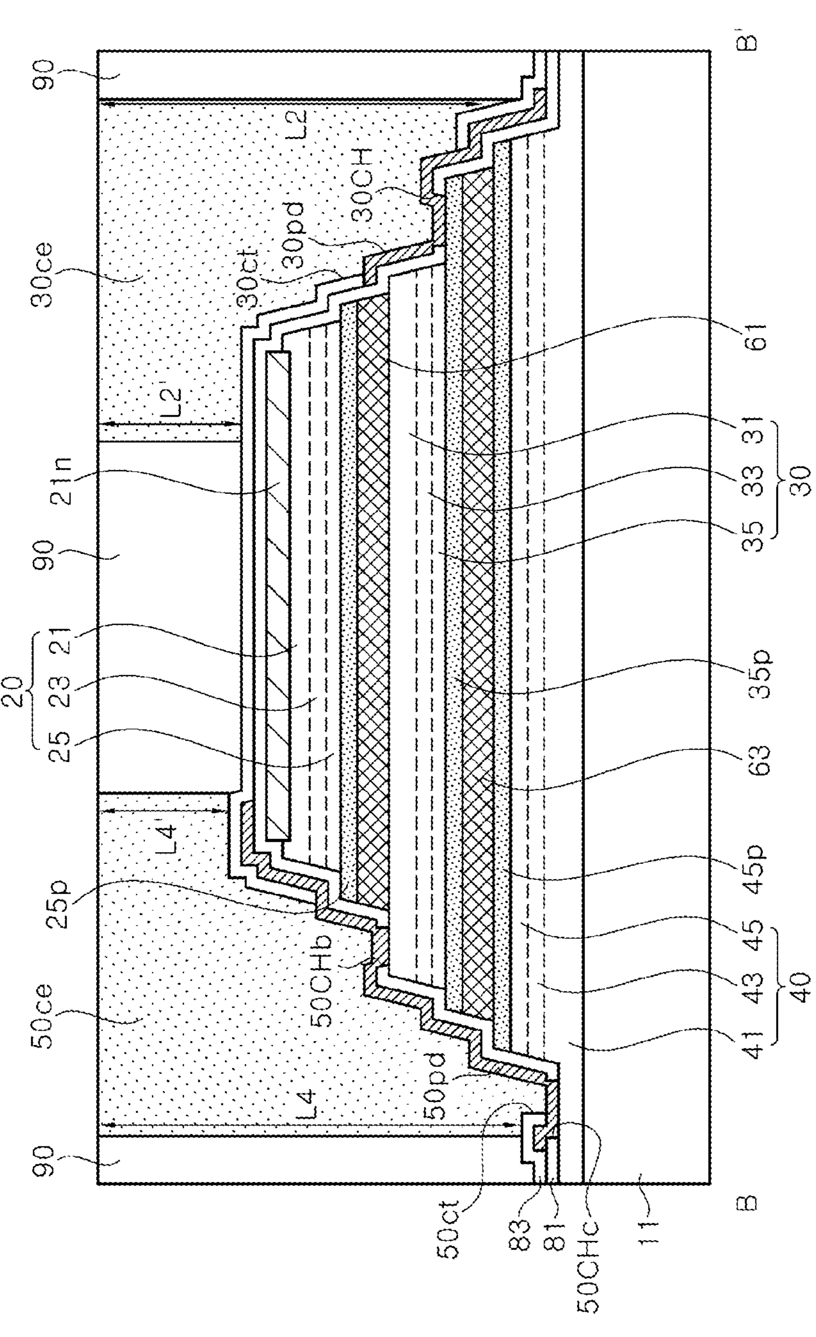

FIG. 1A shows a schematic perspective view of a light emitting device according to an exemplary embodiment., FIG. 1B is a schematic plan view of the light emitting device of FIG. 1A, and FIG. 1C and FIG. 1D are schematic cross-sectional views taken along lines A-A' and B-B' of FIG. 1B, respectively.

Referring to FIGS. 1A and 1B, a light emitting device 100 according to an exemplary embodiment includes a light emitting stack structure, a first connection electrode 20*ce*, a second connection electrode 30*ce*, a third connection electrode 40*ce*, and a fourth connection electrode 50*ce* formed on the light emitting stack structure, and a protection layer 90 surrounding the connection electrodes 20*ce*, 30*ce*, 40*ce*, and 50*ce*. An array of light emitting devices 100 may be formed on a substrate 11, and FIG. 1A exemplarily illustrates the light emitting device 100 singularized from the array, and thus may also be referred to as a light emitting device. Formation and singularization of the light emitting devices 100 will be described in more detail later. In some exemplary embodiments, the light emitting device 100 including the light emitting stack structure may be further processed to be formed into a light emitting package, which will also be described in more detail later.

Referring to FIGS. 1A through 1D, the light emitting device 100 according to the illustrated exemplary embodiment may include a light emitting stack structure, and include a first LED sub-unit, a second LED sub-unit, and a third LED sub-unit disposed on a substrate 11. The first LED sub-unit may include a first light emitting stack 20, the second LED sub-unit may include a second light emitting stack 30, and the third LED sub-unit may include a third light emitting stack 40. The light emitting stack structure is exemplarily shown as including three light emitting stacks 20, 30, and 40, but the inventive concepts are not limited to a specific number of light emitting stacks. For example, in some exemplary embodiments, the light emitting stack structure may include two or more numbers of light emitting stacks. Hereinafter, the light emitting stack structure will exemplarily be described as including three light emitting stacks 20, 30, and 40.

The substrate 11 may include a light-transmitting insulating material to transmit light. However, in some exemplary embodiments, the substrate 11 may be formed to be translucent or partially transparent to transmit only light of a specific wavelength or only a portion of light of a specific wavelength. The substrate 11 may be a growth substrate capable of epitaxially growing the third light emitting stack 40 thereon, such as a sapphire substrate. However, the substrate 11 is not limited to the sapphire substrate, and may include other various transparent insulating materials. For example, the substrate 11 may include glass, quartz, silicon, an organic polymer, or an organic-inorganic composite material, such as silicon carbide (SiC), gallium nitride (GaN), indium gallium nitride (InGaN), aluminum gallium nitride (AlGaN), aluminum nitride (AlN), gallium oxide ($Ga_2O_3$), or a silicon substrate. In addition, the substrate 11 may include irregularities on an upper surface thereof, and for example, may be a patterned sapphire substrate. The irregularities formed on the upper surface of the substrate 11 may increase extraction efficiency of light generated in the third light emitting stack 40, which is in contact with the substrate 11. The irregularities of the substrate 11 may be selectively increase luminance intensity of the third LED stack 40 compared to those of the first LED stack 20 and the second LED stack 30. In another exemplary embodiment, the substrate 11 may be removed from the light emitting device 100. By removing the substrate 11, a viewing angle of light emitted from the first, second, and third light emitting stacks 20, 30, and 40 may be reduced, which will be described in more detail later.

The first, second, and third light emitting stacks 20, 30, and 40 are configured to emit light toward the substrate 11. Accordingly, light emitted from the first light emitting stack 20 may pass through the second and third light emitting stacks 30 and 40. According to an exemplary embodiment, the first, second, and third light emitting stacks 20, 30, and 40 may emit light having different peak wavelengths from one another. In an exemplary embodiment, a light emitting stack disposed further from the substrate 11 emits light having a longer wavelength than that of light emitted from a light emitting stack disposed closer to the substrate 11, and thus, light loss may be reduced. In another exemplary embodiment, to adjust a color mixing ratio of the first, second, and third light emitting stacks 20, 30, and 40, the second LED stack 30 may emit light having a shorter wavelength than that emitted from the third LED stack 40. Accordingly, luminance intensity of the second LED stack 30 may be reduced, and luminance intensity of the third LED stack 40 may be increased, and thus, luminance intensity ratios of light emitted from the first, second, and third light emitting stacks 20, 30, and 40 may be substantially changed and controlled. For example, the first emission stack 20 may be configured to emit red light, the second emission stack 30 may be configured to emit blue light, and the third emission stack 40 may be configured to emit green light. As such, luminance intensity of blue light may be relatively reduced, and luminance intensity of green light may be relatively increased, and thus, luminance intensity ratios of red, green, and blue light may be easily adjusted to approach 3:6:1. Moreover, light emitting areas of the first, second, and third LED stacks 20, 30, and 40 may be about 10000 $\mu m^2$ or less, and further, 4000 $\mu m^2$, furthermore, 2500 $\mu m^2$ or less. In addition, as a light emitting stack is disposed closer to the substrate 11, the emitting area thereof may become larger. As such, since the third LED stack 40 that emits green light is disposed closest to the substrate 11, luminance intensity of green light may be further increased.

The first light emitting stack 20 includes a first conductivity type semiconductor layer 21, an active layer 23, and a second conductivity type semiconductor layer 25. According to an exemplary embodiment, the first light emitting stack 20 may include a semiconductor material, such as AlGaAs, GaAsP, AlGaInP, and GaP that emits red light, but the inventive concepts are not limited thereto.

A first upper contact electrode 21*n* may be disposed on the first conductivity type semiconductor layer 21 and may be in ohmic contact with the first conductivity type semiconductor layer 21. A first lower contact electrode 25*p* may be disposed under the second conductivity type semiconductor layer 25.

According to an exemplary embodiment, a portion of the first conductivity type semiconductor layer 21 may be patterned and recessed, and the first upper contact electrode 21*n* may be disposed in a recessed region of the first conductivity type semiconductor layer 21 to increase an ohmic contact level. The first upper contact electrode 21*n* may have a single-layer structure or a multiple-layer structure, and may include Al, Ti, Cr, Ni, Au, Ag, Sn, W, Cu, or an alloy thereof, such as Au—Te alloy or Au—Ge alloy, but the inventive concepts are not limited thereto. In an exemplary embodiment, the first upper contact electrode 21*n* may have a thickness of about 100 nm, and may include metal having high reflectivity to increase light emission efficiency in a downward direction toward the substrate 11.

The second light emitting stack 30 includes a first conductivity type semiconductor layer 31, an active layer 33, and a second conductivity type semiconductor layer 35. According to an exemplary embodiment, the second light emitting stack 30 may include a semiconductor material, such as GaN, InGaN, ZnSe that emits blue light, but the inventive concepts are not limited thereto. A second lower contact electrode 35*p* is disposed on the second conductivity type semiconductor layer 35 of the second light emitting stack 30.

The third light emitting stack 40 includes a first conductivity type semiconductor layer 41, an active layer 43, and a second conductivity type semiconductor layer 45. According to an exemplary embodiment, the third light emitting stack 40 may include a semiconductor material, such as GaN, InGaN, GaP, AlGaInP, AlGaP, or the like that emits green light. A third lower contact electrode 45*p* is disposed on the second conductivity type semiconductor layer 45 of the third light emitting stack 40.

According to an exemplary embodiment, each of the first conductivity type semiconductor layers 21, 31, and 41 and the second conductivity type semiconductor layers 25, 35, and 45 of the first, second, and third light emitting stacks 20, 30, and 40 may have a single-layer structure or a multiple-layer structure, and in some exemplary embodiments, may include a superlattice layer. Moreover, the active layers 23, 33, and 43 of the first, second, and third light emitting stacks 20, 30, and 40 may have a single-quantum well structure or a multiple-quantum well structure.

Each of the first, second, and third lower contact electrodes 25*p*, 35*p*, and 45*p* may include a transparent conductive material that transmits light. For example, the lower contact electrodes 25*p*, 35*p*, and 45*p* may include transparent conductive oxide (TCO), such as SnO, $InO_2$, ZnO, ITO, ITZO, or the like, without being limited thereto.

A first adhesive layer 61 is disposed between the first light emitting stack 20 and the second light emitting stack 30, and a second adhesive layer 63 is disposed between the second light emitting stack 30 and the third light emitting stack 40. The first and second adhesive layers 61 and 63 may include a non-conductive material that transmits light. For example, the first and second adhesive layers 61 and 63 may include an optically clear adhesive (OCA), which is epoxy, polyimide, SU8, spin-on-glass (SOG), benzocyclobutene (BCB), but the inventive concepts are not limited thereto.

According to the illustrated exemplary embodiment, a first insulation layer 81 and a second insulation layer 83 are disposed on at least portions of side surfaces of the first, second, and third light emitting stacks 20, 30, and 40. At least one of the first and second insulation layers 81 and 83 may include various organic or inorganic insulating materials, such as polyimide, $SiO_2$, $SiN_x$, $Al_2O_3$, or the like. For example, at least one of the first and second insulation layers 81 and 83 may include a distributed Bragg reflector (DBR). As another example, at least one of the first and second insulation layers 81 and 83 may include a black organic polymer. In some exemplary embodiments, an electrically floating metal reflection layer may be disposed on the first and second insulation layers 81 and 83 to reflect light emitted from the light emitting stacks 20, 30, and 40 toward the substrate 11. In some exemplary embodiments, at least one of the first and second insulation layers 81 and 83 may have a single-layer structure or a multiple-layer structure formed of two or more insulation layers having different refractive indices.

According to an exemplary embodiment, each of the first, second, and third light emitting stacks 20, 30, and 40 may be driven independently. More specifically, a common voltage may be applied to one of the first and second conductivity type semiconductor layers of each of the light emitting stacks, and an individual emission signal may be applied to the remaining one of the first and second conductivity type semiconductor layers of each of the light emitting stacks. For example, according to an exemplary embodiment, the first conductivity type semiconductor layers 21, 31, and 41 of each of the light emitting stacks 20, 30, and 40 may be n-type, and the second conductivity type semiconductor layers 25, 35, and 45 of each of the light emitting stacks 20, 30, and 40 may be p-type. In this case, the third light emitting stack 40 may have a stacked sequence that is opposite to those of the first light emitting stack 20 and the second light emitting stack 30, and thus, the p-type semiconductor layer 45 may be disposed on the active layer 43 to simplify processes of manufacturing the light emitting device 100. Hereinafter, the first conductivity type and the second conductivity type semiconductor layers will be described with reference to n-type and p-type, respectively. In some exemplary embodiments, however, n-type and p-type may be reversed.

Each of the first, second, and third lower contact electrodes 25*p*, 35*p*, and 45*p* that are connected to the p-type semiconductor layers 25, 35, and 45 of the light emitting stacks, respectively, may be electrically connected to the first, second, and third connection electrodes 20*ce*, 30*ce*, and 40*ce* to receive corresponding light emission signals, respectively. Meanwhile, the n-type semiconductor layers 21, 31, and 41 of the light emitting stacks may be commonly electrically connected to the fourth connection electrode 50*ce*. As such, the light emitting device 100 may have a common n-type light emitting stack structure, in which the n-type semiconductor layers 21, 31, and 41 of the first, second, and third light emitting stacks 20, 30, and 40 are commonly connected, and may be driven independently from one another. Since the light emitting device 100 has the common n-type light emitting structure, sources of voltages applied to the first, second, and third light emitting stacks 20, 30, and 40 may be set to be different from one another.

The light emitting device 100 according to the illustrated exemplary embodiment has the common n-type structure, but the inventive concepts are not limited thereto. For example, in some exemplary embodiments, the first conductivity type semiconductor layers 21, 31, and 41 of each of the light emitting stacks may be p-type, and the second conductivity type semiconductor layer 25, 35, and 45 of each of the light emitting stacks may be n-type, and thus, a common p-type light emitting stack structure may be formed. In addition, in some exemplary embodiments, the stacked sequence of each of the light emitting stacks is not limited to that shown in the drawing, but may be variously modified.

Hereinafter, the light emitting device 100 will be described with reference to the common n-type light emitting stack structure.

According to the illustrated exemplary embodiment, the light emitting device 100 includes a first pad 20*pd*, a second pad 30*pd*, a third pad 40*pd*, and a fourth pad 50*pd*. The first pad 20*pd* is electrically connected to the first lower contact electrode 25*p* through a first contact hole 20CH defined through the first insulation layer 81. The first connection electrode 20*ce* is electrically connected to the first pad 20*pd* through a first through hole 20*ct* defined through the second insulation layer 83. The second pad 30*pd* is electrically connected to the second lower contact electrode 35*p* through a second contact hole 30CH defined through the first insulation layer 81. The second connection electrode 30*ce* is electrically connected to the second pad 30*pd* through a second through hole 30*ct* defined through the second insulation layer 83.

The third pad 40*pd* is electrically connected to the third lower contact electrode 45*p* through a third contact hole 40CH defined through the first insulation layer 81. The third connection electrode 40*ce* is electrically connected to the third pad 40*pd* through a third through hole 40*ct* defined through the second insulation layer 83. The fourth pad 50*pd* is electrically connected to the first conductivity type semiconductor layers 21, 31, and 41 of the first, second, and third light emitting stacks 20, 30, and 40 through a first sub-contact hole 50CHa, a second sub-contact hole 50CHb, and a third sub-contact hole 50CHc defined on the first conductivity type semiconductor layers 21, 31, and 41 of the first, second, and third light emitting stacks 20, 30, and 40. In particular, the first sub-contact hole 50CHa may expose the first upper contact electrode 21*n*, and the fourth pad 50*pd* may be connected to the first upper contact electrode 21*n* through the first sub-contact hole 50CHa. In this manner, the fourth pad 50*pd* may be electrically connected to the first conductivity type semiconductor layers 21, 31, and 41 through the sub-contact holes 50CHa, 50CHb, 50CHc, so that a process of manufacturing the light emitting device 100 may be simplified. The fourth connection electrode 50*ce* is electrically connected to the fourth pad 50*pd* through a fourth through hole 50*ct* defined through the second insulation layer 83.

In the illustrated exemplary embodiment, although each of the connection electrodes 20*ce*, 30*ce*, 40*ce*, and 50*ce* is shown and described as directly contacting the pads 20*pd*, 30*pd*, 40*pd*, and 50*pd*, in some exemplary embodiments, the connection electrodes 20*ce*, 30*ce*, 40*ce*, and 50*ce* may not be directly connected to the pads 20*pd*, 30*pd*, 40*pd*, and 50*pd*, and another connectors may be interposed therebetween.

The first, second, third, and fourth pads 20*pd*, 30*pd*, 40*pd*, and 50*pd* are spaced apart from one another and insulated from each other. According to an exemplary embodiment, each of the first, second, third, and fourth pads 20*pd*, 30*pd*, 40*pd*, and 50*pd* may cover at least portions of side surfaces of the first, second, and third light emitting stacks 20, 30, and 40. In this manner, heat generated from the first, second, and third light emitting stacks 20, 30, and 40 may be easily dissipated.

According to the illustrated exemplary embodiment, each of the connection electrodes 20*ce*, 30*ce*, 40*ce*, and 50*ce* may have a substantially elongated shape that protrudes upward from the substrate 11. The connection electrodes 20*ce*, 30*ce*, 40*ce*, and 50*ce* may include metal, such as Cu, Ni, Ti, Sb, Zn, Mo, Co, Sn, Ag, or an alloy thereof, but the inventive concepts are not limited thereto. For example, each of the connection electrodes 20*ce*, 30*ce*, 40*ce*, and 50*ce* may include two or more metals or a plurality of different metal layers to reduce stress from the elongated shape of the connection electrodes 20*ce*, 30*ce*, 40*ce*, and 50*ce*. In another exemplary embodiment, the connection electrodes 20*ce*, 30*ce*, 40*ce*, and 50*ce* may include Cu, and an additional metal may be deposited or plated to inhibit oxidation of Cu. In some exemplary embodiments, the connection electrodes 20*ce*, 30*ce*, 40*ce*, and 50*ce* may include Cu/Ni/Sn, and Cu may prevent Sn from permeating into the light emitting stack structure. In some exemplary embodiments, the connection electrodes 20*ce*, 30*ce*, 40*ce*, and 50*ce* may include a seed layer for forming a metal layer in a plating process, which will be described in more detail later.

As shown in the drawings, each of the connection electrodes 20*ce*, 30*ce*, 40*ce*, and 50*ce* may have a substantially flat upper surface, thereby facilitating electrical connection between external lines (which will be described later) or electrodes and the light emitting stack structure. According to the illustrated exemplary embodiment, when the light emitting device 100 includes micro LEDs having a surface area of about 10,000 $\mu m^2$ or less, about 4,000 $\mu m^2$ or less, or about 2,500 $\mu m^2$ or less as known in the art, the connection electrodes 20*ce*, 30*ce*, 40*ce*, and 50*ce* may be overlapped with at least a portion of one of the first, second, and third light emitting stacks 20, 30, and 40 as shown in the drawing. More specifically, the connection electrodes 20*ce*, 30*ce*, 40*ce*, and 50*ce* may be overlapped with at least one step that is formed on the side surface of the light emitting stack structure. As such, since an area of a lower surface of the connection electrode is greater than that of an upper surface thereof, a larger contact area may be formed between the connection electrode 20*ce*, 30*ce*, 40*ce*, and 50*ce* and the light emitting stack structure. Accordingly, the connection electrodes 20*ce*, 30*ce*, 40*ce*, and 50*ce* may be more stably formed on the light emitting stack structure than those of a conventional light emitting device. For example, lengths L1, L2, L3, and L4 of one side surface that faces the outside of the connection electrodes 20*ce*, 30*ce*, 40*ce*, and 50*ce* may be different from lengths L1', L2', L3', and L4' of one side surface that faces toward a center of the light emitting device 100. More specifically, the length of one side surface of the connection electrode that faces the outside may be greater than that of another side surface that faces the center of the light emitting device 100. For example, a difference in lengths L and L' of two surfaces opposite to each other may be greater than a thickness (or height) of one of the light emitting stacks 20, 30, and 40. In this manner, the structure of the light emitting device 100 may be strengthened with a larger contact area between the connection electrodes 20*ce*, 30*ce*, 40*ce*, and 50*ce* and the light emitting stack structure. In addition, since the connection electrodes 20*ce*, 30*ce*, 40*ce*, and 50*ce* may be overlapped with at least one step that is formed on the side surface of the light emitting stack structure, heat generated in the light emitting stack structure may be dissipated to the outside more efficiently.

According to an exemplary embodiment, a difference between the length L1, L2, L3 or L4 of one side surface of the connection electrode that faces to the outside and the lengths L1', L2' L3', and L4' of the another side surface that faces the center of the light emitting device 100 may be about 3 m. In this case, the light emitting stack structure may be formed thin, and in particular, the first light emitting stack 20 may have a thickness of about 1 m, the second light emitting stack 30 may have a thickness of about 0.7 m, the third light emitting stack 40 may have a thickness of about 0.7 m, and each of the first and second adhesive layers may have a thickness of about 0.2 m to about 0.3 am. According to another exemplary embodiment, a difference between the length L1, L2, L3 or L4 of one side surface of the connection electrode that faces to the outside and the lengths L1', L2' L3', and L4' of the another side surface that faces the center of the light emitting device 100 may be about 10 m to about 16 km. In this case, the light emitting stack structure may be formed relatively thick to have more stable structure, and in particular, the first light emitting stack 20 may have a thickness of about 4 m to about 5 m, the second light emitting stack 30 may have a thickness of about 3 m, the third light emitting stack 40 may have a thickness of about 3 m, and each of the first and second adhesive layers may have a thickness of about 0.3 m. According to another exemplary embodiment, a difference between the length L1, L2, L3 or L4 of one side surface of the connection electrode that faces to the outside and the lengths L1', L2' L3', and L4' of the another side surface that faces the center of the light emitting device 100 may be about 25% of a length of the largest side surface. However, the inventive concepts are not limited to a particular difference in lengths between the two surfaces of the connection electrode opposite to each other, and the difference in lengths between the two surfaces opposite to each other may be variously changed.

In some exemplary embodiments, at least one of the connection electrodes 20*ce*, 30*ce*, 40*ce*, and 50*ce* may be overlapped with the side surface of each of the light emitting stacks 20, 30, and 40, and thus, the light emitting stacks 20, 30, and 40 may efficiently dissipate heat that is generated inside thereof. Further, when the connection electrodes 20*ce*, 30*ce*, 40*ce*, and 50*ce* include a reflective material such as metal, the connection electrodes 20*ce*, 30*ce*, 40*ce*, and 50*ce* may reflect light that is emitted from at least one or more of the light emitting stacks 20, 30, and 40, and thus, luminous efficiency may be improved In general, during the manufacturing process, an array of a plurality of light emitting devices is formed on a substrate. The substrate is cut along a scribing line to singularize (separate) each of the light emitting devices, and the light emitting device may be transferred to another substrate or a tape using various transfer techniques for further processing of the light emitting devices, such as packaging. In this case, when the light emitting device includes connection electrodes such as metal bumps or pillars protruding outward from the light emitting structure due to the structure of the light emitting device exposing the connection electrodes to the outside, various problems may occur during a subsequent process, such as during a transfer stage. In addition, when the light emitting device includes micro-LEDs having a surface area of about 10,000 $\mu m^2$ or less, of about 4,000 $\mu m^2$ or less, or about 2,500 $\mu m^2$ or less, depending on the application, handling of the light emitting device may be more difficult due to its small form factor.

For example, when the connection electrode has a substantially elongated shape such as a rod, transferring the light emitting device using a conventional vacuum method may become difficult because the light emitting device may not have a sufficient suction area due to the protruding structure of the connection electrode. In addition, the exposed connection electrode may be directly affected by various stresses during a subsequent process, such as when the connection electrode contacts a manufacturing apparatus, which may damage the structure of the light emitting device. As another example, when the light emitting device is transferred by attaching an adhesive tape on the upper surface of the light emitting device (for example, a surface opposite to the substrate), a contact area between the light emitting device and the adhesive tape may be limited to the upper surface of the connection electrode. In this case, contrary to when the adhesive tape is attached to the lower surface of the light emitting device (for example, the substrate), an adhesive force of the light emitting device to the adhesive tape may be weakened, and the light emitting device may be undesirably separated from the adhesive tape while transferring the light emitting device. As still another example, when transferring the light emitting device using a conventional pick-and-place method, a discharge pin may directly contact a portion of the light emitting device disposed between connection pins, and thus, an upper structure of the light emitting structure may be damaged. In particular, the discharge pin may hit the center of the light emitting device, and cause physical damage to an upper light emitting stack of the light emitting device.

According to an exemplary embodiment, the protection layer 90 may be formed on the light emitting stack structure. More specifically, as shown in FIG. 1A, the protection layer 90 may be formed between the connection electrodes 20*ce*, 30*ce*, 40*ce*, and 50*ce* to cover at least the side surface of the light emitting stack structure. According to the illustrated exemplary embodiment, the protection layer 90 may expose side surfaces of the substrate 11, the first and second insulation layers 81 and 83, and the third light emitting stack 40. The protection layer 90 may be formed to be substantially flush with the upper surfaces of the connection electrodes 20*ce*, 30*ce*, 40*ce*, and 50*ce*, and may include an epoxy molding compound (EMC), which may be formed in various colors, such as black, white, or transparent. However, the inventive concepts are not limited thereto. For example, in some exemplary embodiments, the protection layer 90 may include polyimide (PID), and in this case, PID may be provided as a dry film rather than a liquid type to increase flatness when PID is applied to the light emitting stack structure. In some exemplary embodiments, the protection layer 90 may include a photosensitive substance. In this manner, the protection layer 90 may provide a sufficient contact area to the light emitting device 100 not only to protect the light emitting structure from external impacts that may be applied during subsequent processes, but also to facilitate handling during the subsequent transfer step. In addition, the protection layer 90 may prevent light leakage from the side surface of the light emitting device 100 to prevent or at least to suppress interference of light emitted from an adjacent light emitting device 100.

Figure 2:
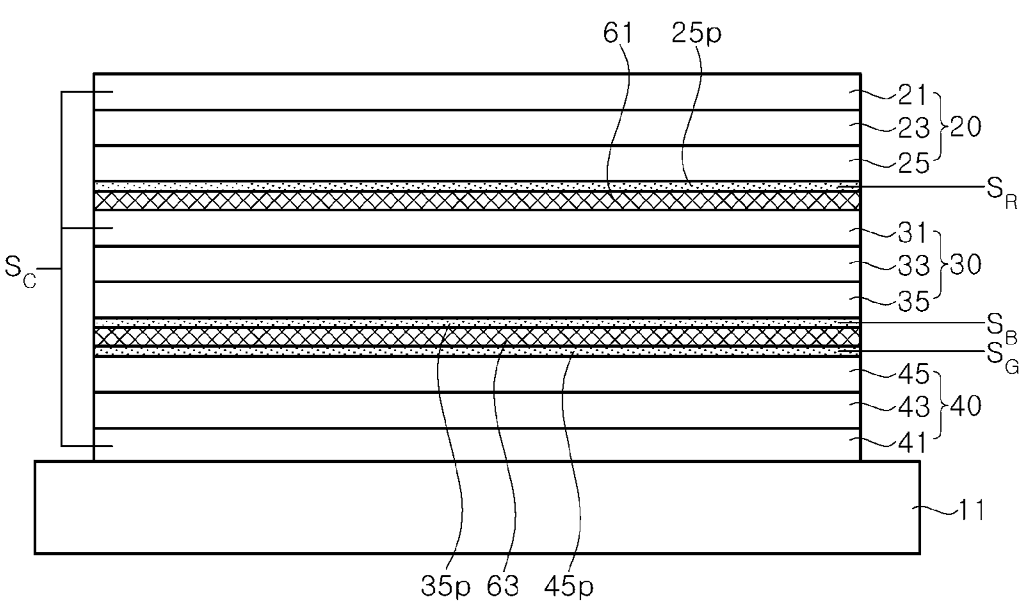
FIG. 2 is a schematic cross-sectional view of a light emitting stack structure according to an exemplary embodiment.

FIG. 2 is a schematic cross-sectional view of a light emitting stack structure according to an exemplary embodiment. Since the light emitting stack structure according to the illustrated exemplary embodiment is substantially the same as that included in the above-described light emitting device 100, repeated descriptions of the same elements forming the light emitting stack structure will be omitted to avoid redundancy.

Referring to FIG. 2, first, second, and third lower contact electrodes 25*p*, 35*p*, and 45*p* according to an exemplary embodiment may be connected to emission signal lines $S_R$, $S_G$, and $S_B$, respectively. First conductivity type semiconductor layers 21, 31, and 41 of first, second, and third light emitting stacks 20, 30, and 40 may be connected to a common line Sc. The common line Sc may be connected to the first conductivity type semiconductor layer 21 of the first light emitting stack 20 through a first upper contact electrode 21*n* shown in FIGS. 1C and 1D.

According to an exemplary embodiment, different voltages may be applied to the first, second, and third light emitting stacks 20, 30, and 40 by including an n-common structure. For example, the first emission stack 20 emitting red light may be applied with a relatively low voltage compared to those applied to the second and third emission stacks 30 and 40 emitting blue light and green light. Therefore, a voltage source suitable for each of the light emitting stacks may be individually used to reduce power loss. In the illustrated exemplary embodiment, the first, second, and third light emitting stacks 20, 30, and 40 may be individually controlled to selectively emit light by using the light emission signal lines $S_R$, $S_G$, and $S_B$ and the common line Sc.

FIG. 2 exemplarily shows the light emitting stack structure having the n-common structure, but the inventive concepts are not limited thereto. For example, in some exemplary embodiments, the common line Sc may be electrically connected to the lower contact electrodes 25$p$, 35$p$, and 45$p$ of the first, second, and third light emitting stacks 20, 30, and 40, and the emission signal lines $S_R$, $S_G$, and $S_B$ may be connected to the first conductivity type semiconductor layers 21, 31, and 41 of the first, second, and third emission stacks 20, 30, and 40, respectively.

The light emitting stack structure according to an exemplary embodiment may display light of various colors according to an operating state of each of the light emitting stacks 20, 30, and 40, whereas conventional light emitting devices may display a variety of colors in a combination of multiple light emitting cells that emit light of a single color. More specifically, conventional light emitting devices generally include light emitting cells spaced apart from one another along a two-dimensional plane and emitting light of different colors, for example, red, green, and blue, respectively, to realize a full color display. As such, a relatively large area may be occupied by the conventional light emitting cells. However, the light emitting stack structure according to the exemplary embodiment may emit light of different colors by stacking a plurality of light emitting stacks 20, 30, and 40, and thus, the light emitting stack structure may provide a high level of integration and realize full color display through a smaller area than that of the conventional light emitting apparatus.

In addition, when the light emitting devices 100 are mounted on another substrate to manufacture a display apparatus, the number of devices to be mounted may be significantly reduced compared to the conventional light emitting device. Given that hundreds of thousands or millions of pixels are formed in one display apparatus, manufacturing of the display apparatus using the light emitting device 100 according to an exemplary embodiment may substantially simplify manufacturing process.

According to an exemplary embodiment, the light emitting stack structure may further include various additional elements to improve purity and efficiency of light emitted therefrom. For example, in some exemplary embodiments, a wavelength pass filter may be disposed between the light emitting stacks. In some exemplary embodiments, an irregularity portion may be formed on a light emission surface of at least one of the light emitting stacks to balance the brightness of light between the light emitting stacks. For example, luminance intensity of green light needs to be increased to make the RGB mixing ratio close to 3:6:1. As such, irregularities may be formed on the surface of the substrate 11.

Hereinafter, a method of forming the light emitting device 100 according to an exemplary embodiment will be described with reference to the accompanying drawings.

FIGS. 3A, 4A, 5A, 6A, 7A, and 8A are plan views illustrating a process of manufacturing the light emitting device of FIG. 1A according to an exemplary embodiment. FIGS. 3B, 4B, 5B, 6B, 7B, and 8B are cross-sectional views taken along line A-A' of the corresponding plan views shown in FIGS. 3A, 4A, 5A, 6A, 7A, and 8A according to an exemplary embodiment. FIGS. 4C, 5C, 6C, 7C, and 8C are cross-sectional views taken along line B-B' of the corresponding plan views shown in FIGS. 3A, 4A, 5A, 6A, 7A, and 8A according to an exemplary embodiment. FIGS. 9, 10, 11, 12, and 13 are cross-sectional views schematically showing a process of manufacturing the light emitting device of FIG. 1A according to an exemplary embodiment.

Referring back to FIG. 2, the first conductivity type semiconductor layer 41, the third active layer 43, and the second conductivity type semiconductor layer 45 of the third light emitting stack 40 may be sequentially grown on the substrate 11 by, for example, a metal organic chemical vapor deposition (MOCVD) method or a molecular beam epitaxy (MBE) method. The third lower contact electrode 45$p$ may be formed on the third p-type semiconductor layer 45 by, for example, a physical vapor deposition or chemical vapor deposition method, and may include transparent conductive oxide (TCO), such as SnO, $InO_2$, ZnO, ITO, ITZO, or the like. When the third light emitting stack 40 emits green light according to an exemplary embodiment, the substrate 11 may include $Al_2O_3$ (for example, a sapphire substrate), and the third lower contact electrode 45$p$ may include transparent conductive oxide (TCO) such as tin oxide. The first and second light emitting stacks 20 and 30 may be similarly formed by sequentially growing the first conductivity type semiconductor layer, the active layer, and the second conductivity type semiconductor layer on a temporary substrate, respectively. The lower contact electrodes including transparent conductive oxide (TCO) may be formed by, for example, a physical vapor deposition or chemical vapor deposition method on the second conductivity type semiconductor layer, respectively. In addition, the first and second light emitting stacks 20 and 30 may be coupled to each other with the first adhesive layer 61 interposed therebetween, and at least one of the temporary substrates of the first and second light emitting stacks 20 and 30 may be removed by a laser lift-off process, a chemical process, a mechanical process, or the like. Moreover, the first and second light emitting stacks 20 and 30 may be coupled to the third light emitting stack 40 with the second adhesive layer 63 therebetween, and the remaining temporary substrate of the first and second light emitting stacks 20 and 30 may be removed by a laser lift-off process, a chemical process, a mechanical process, or the like.

Figure 3A:
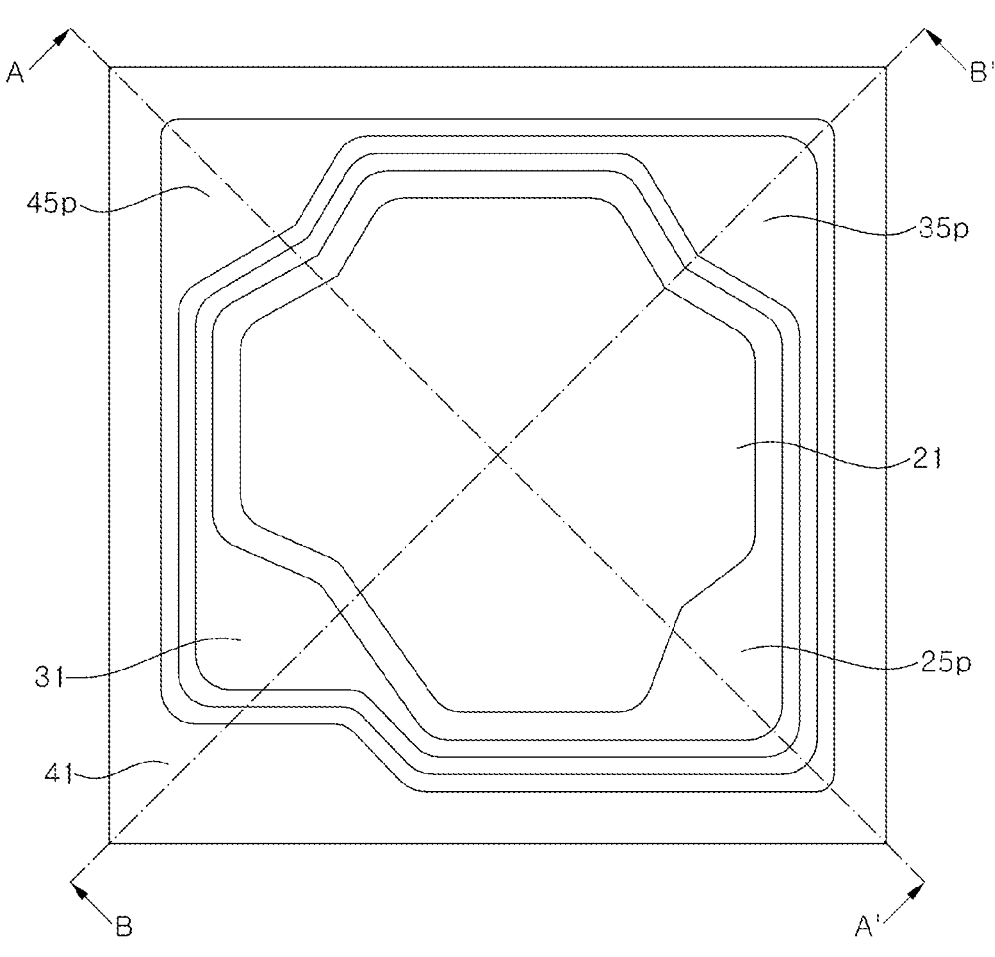
FIGS. 3A, 4A, 5A, 6A, 7A, and 8A are plan views illustrating a process of manufacturing the light emitting device of FIG. 1A according to an exemplary embodiment.
Figure 3B:
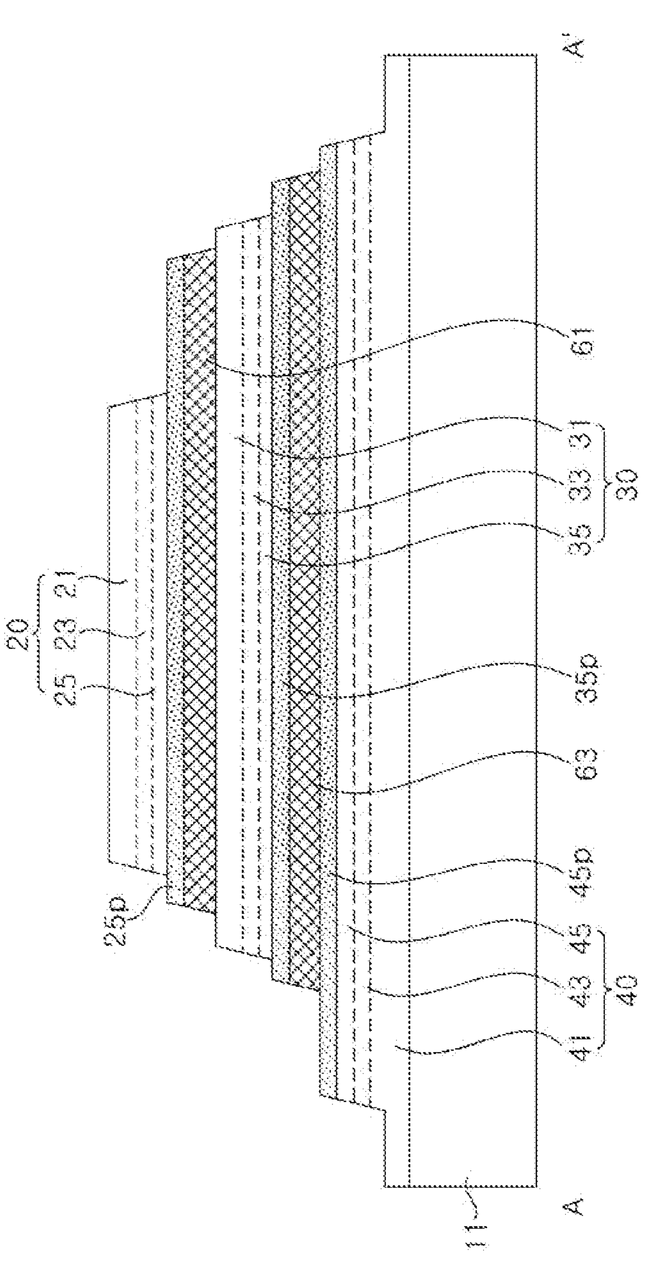
FIGS. 3B, 4B, 5B, 6B, 7B, and 8B are cross-sectional views taken along line A-A' of the corresponding plan views shown in FIGS. 3A, 4A, 5A, 6A, 7A, and 8A according to an exemplary embodiment.
Figure 3C:
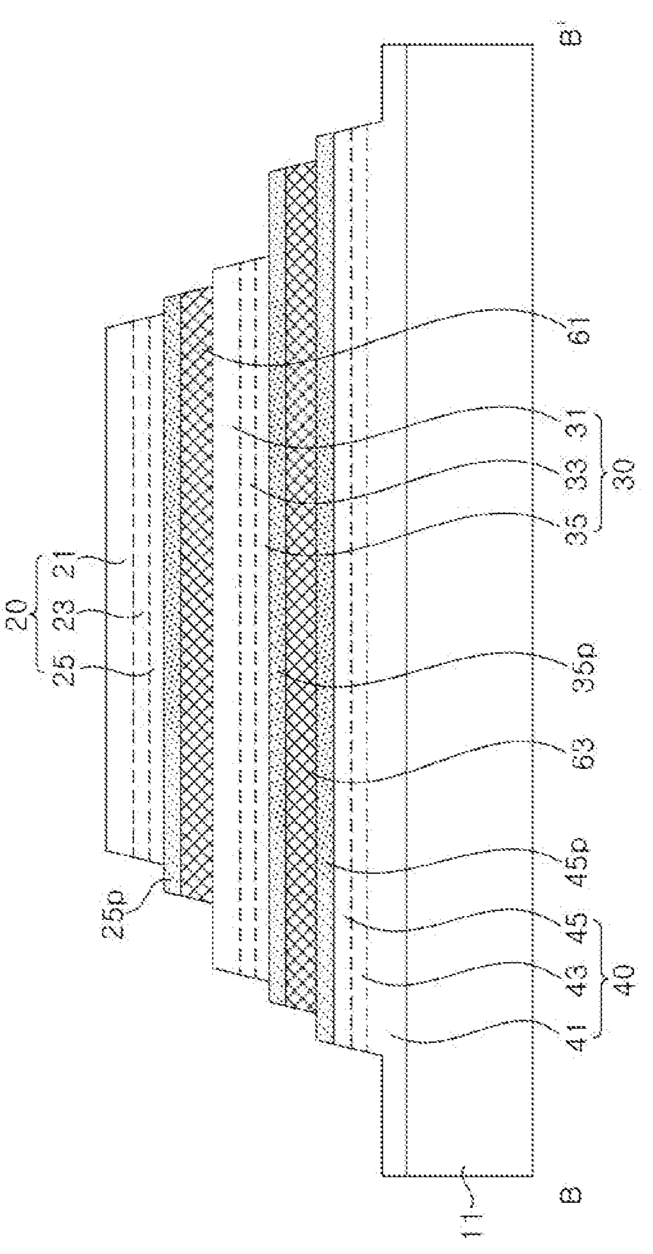
FIGS. 3C, 4C, 5C, 6C, 7C, and 8C are cross-sectional views taken along line B-B' of the corresponding plan views shown in FIGS. 3A, 4A, 5A, 6A, 7A, and 8A according to an exemplary embodiment.

Referring to FIGS. 3A, 3B, and 3C, various portions of each of the first, second, and third light emitting stacks 20, 30, and 40 may be patterned through an etching process or the like to expose a first conductivity type semiconductor layer 21, a first lower contact electrode 25$p$, a first conductivity type semiconductor layer 31, a second lower contact electrode 35$p$, a third lower contact electrode 45$p$, and a first conductivity type semiconductor layer 41. According to the illustrated exemplary embodiment, the first light emitting stack 20 has the smallest area among the light emitting stacks 20, 30, and 40. The third light emitting stack 40 may have the largest area among the light emitting stacks 20, 30, and 40, and thus, luminance intensity of the third light emitting stack 40 may be relatively increased. However, the inventive concepts are not particularly limited to the relative sizes of the light emitting stacks 20, 30, and 40.

Figure 4A:
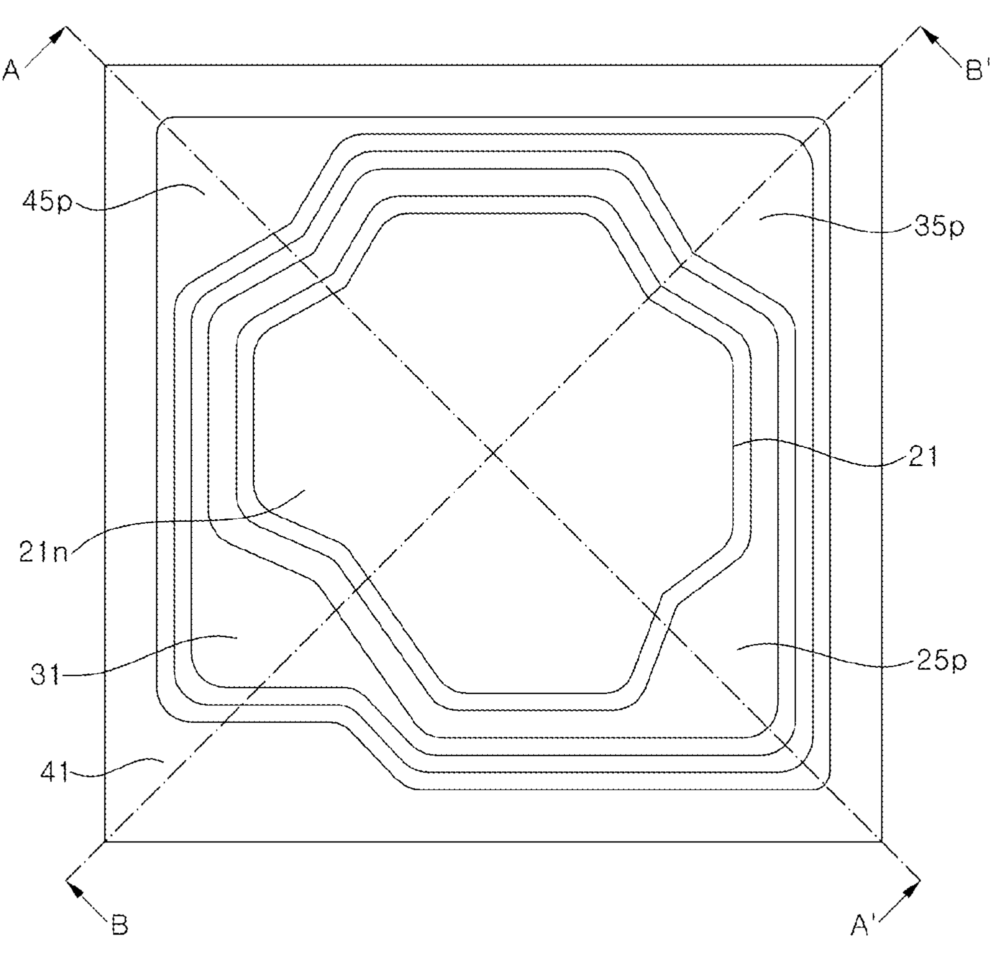
Figure 4B:
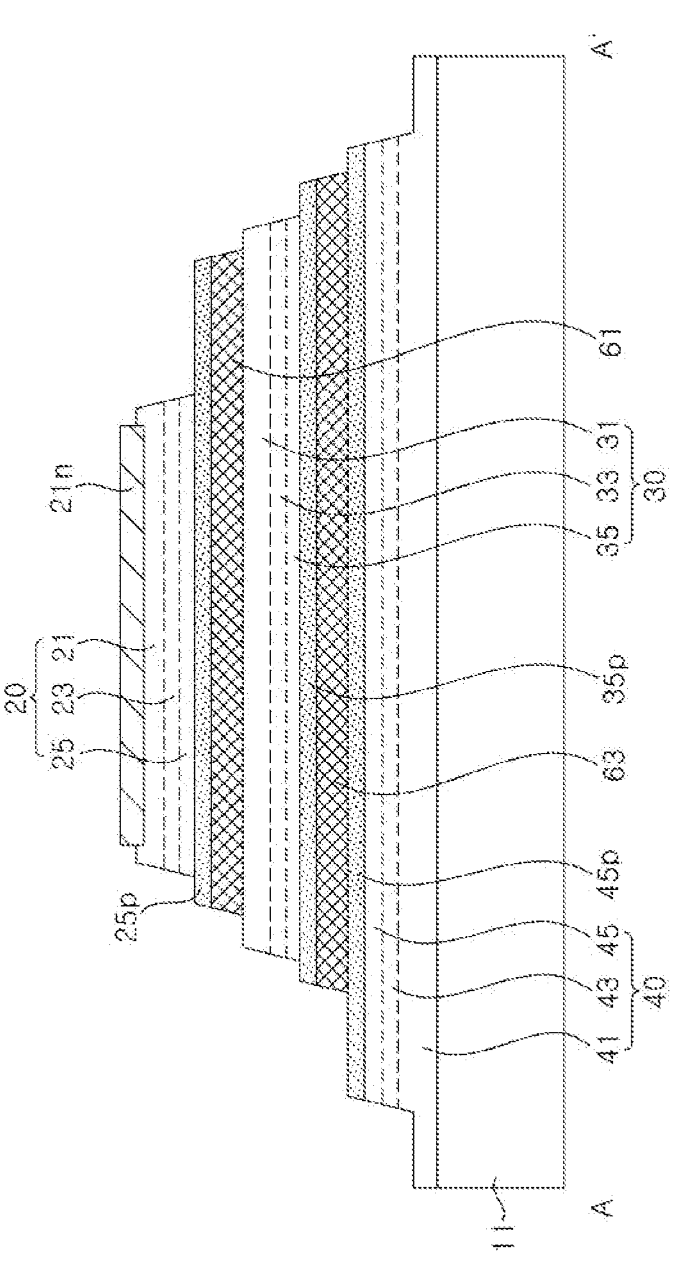
Figure 4C:
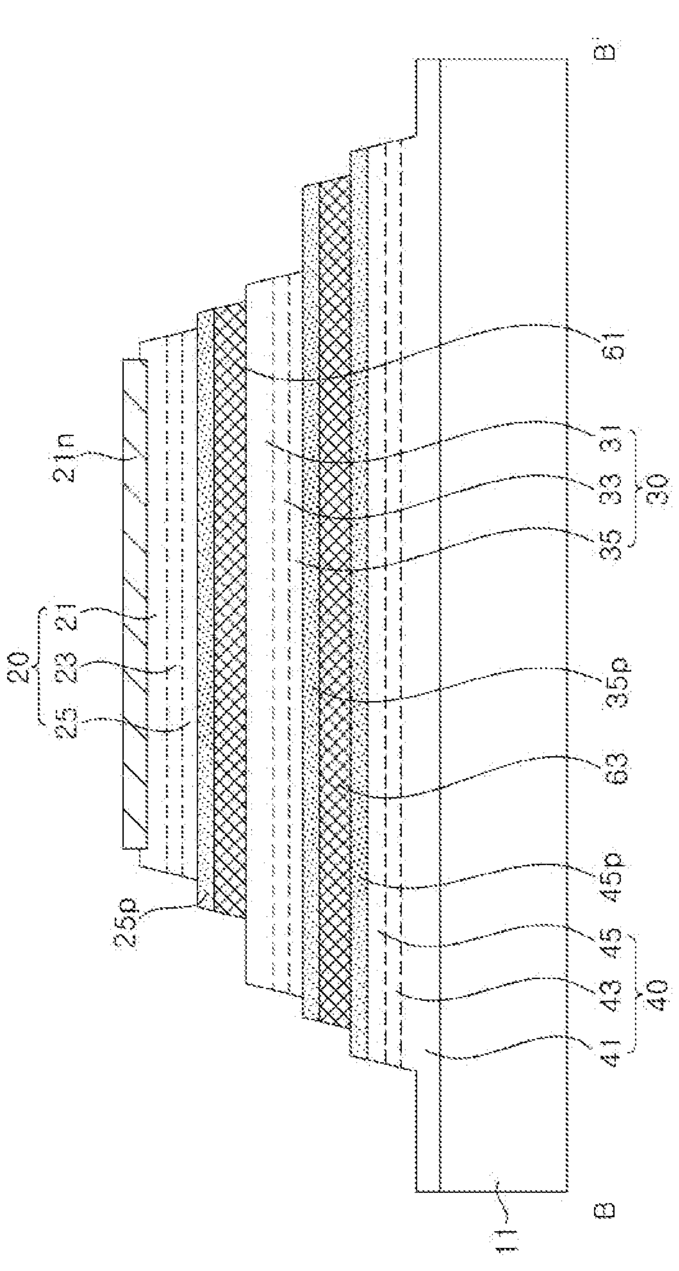

Referring to FIGS. 4A, 4B, and 4C, a portion of an upper surface of the first conductivity type semiconductor layer 21 of the first light emitting stack 20 may be patterned through wet etching or the like to form a first upper contact electrode 21$n$ thereon. As described above, the first upper contact electrode 21*n* is formed to have the thickness of about 100 nm in the recessed region of the first conductivity type semiconductor layer 21 to improve an ohmic contact therebetween.

Figure 5A:
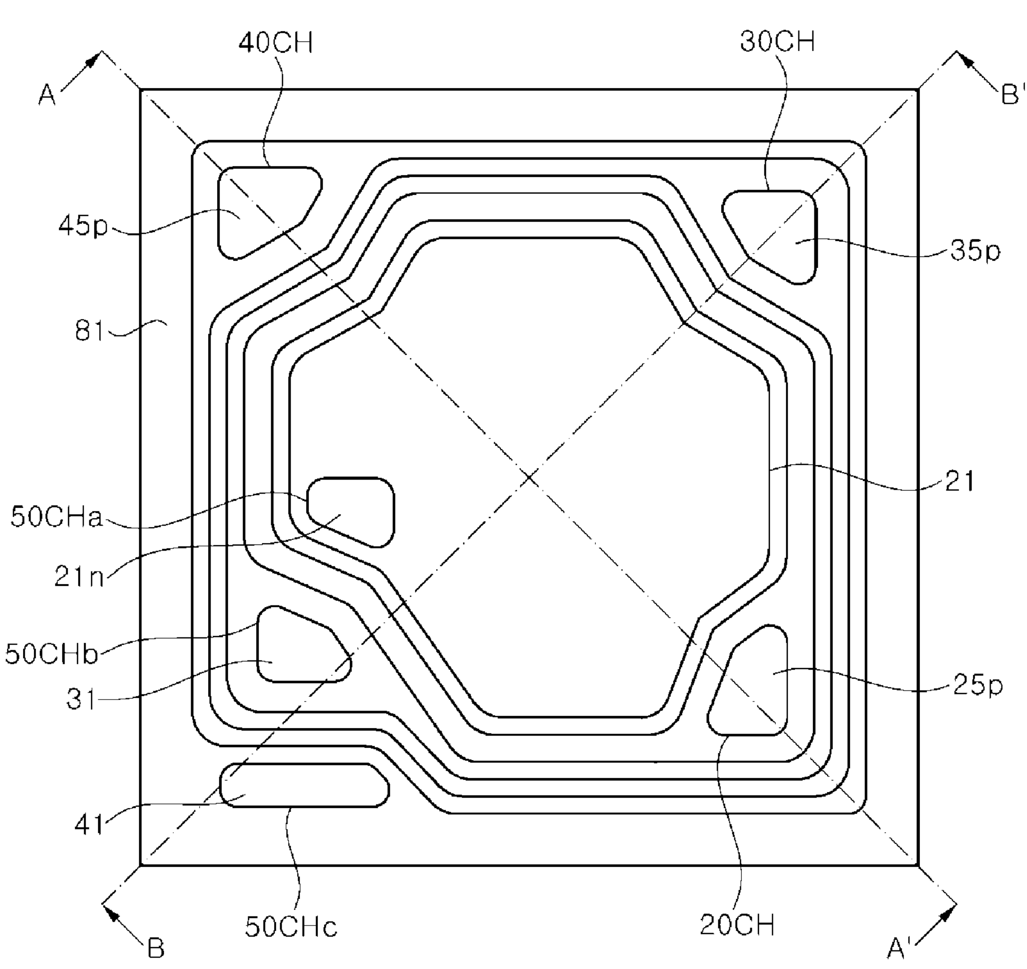
Figure 5B:
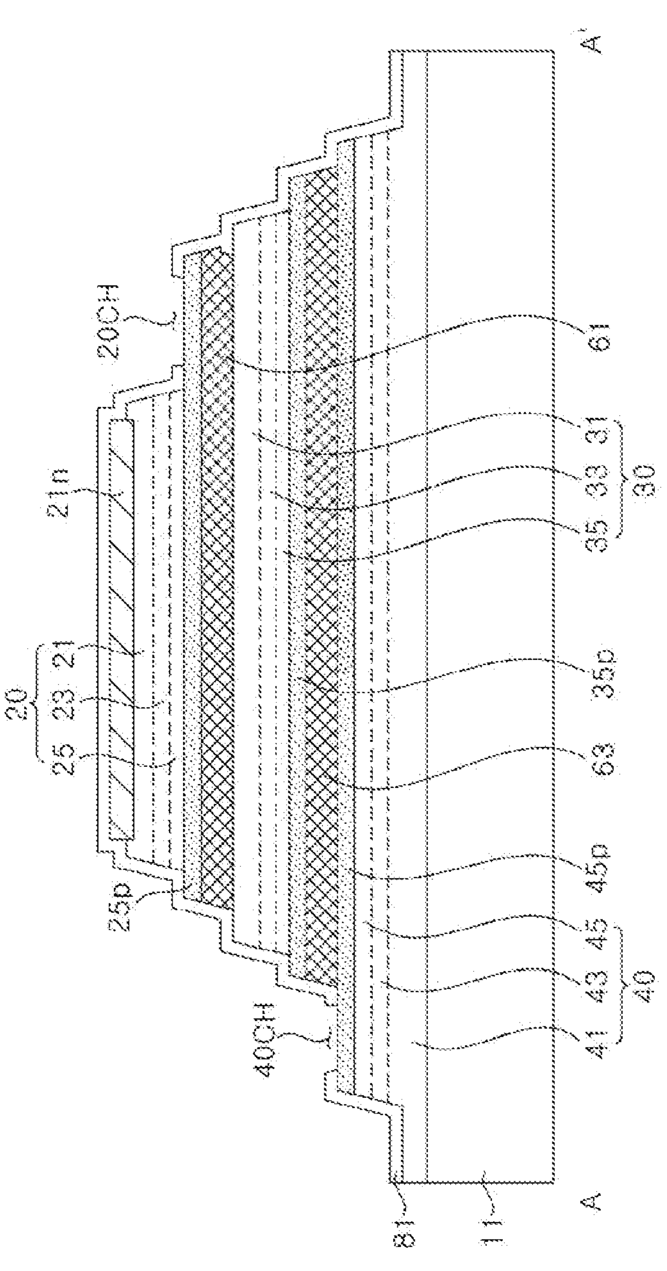
Figure 5C:
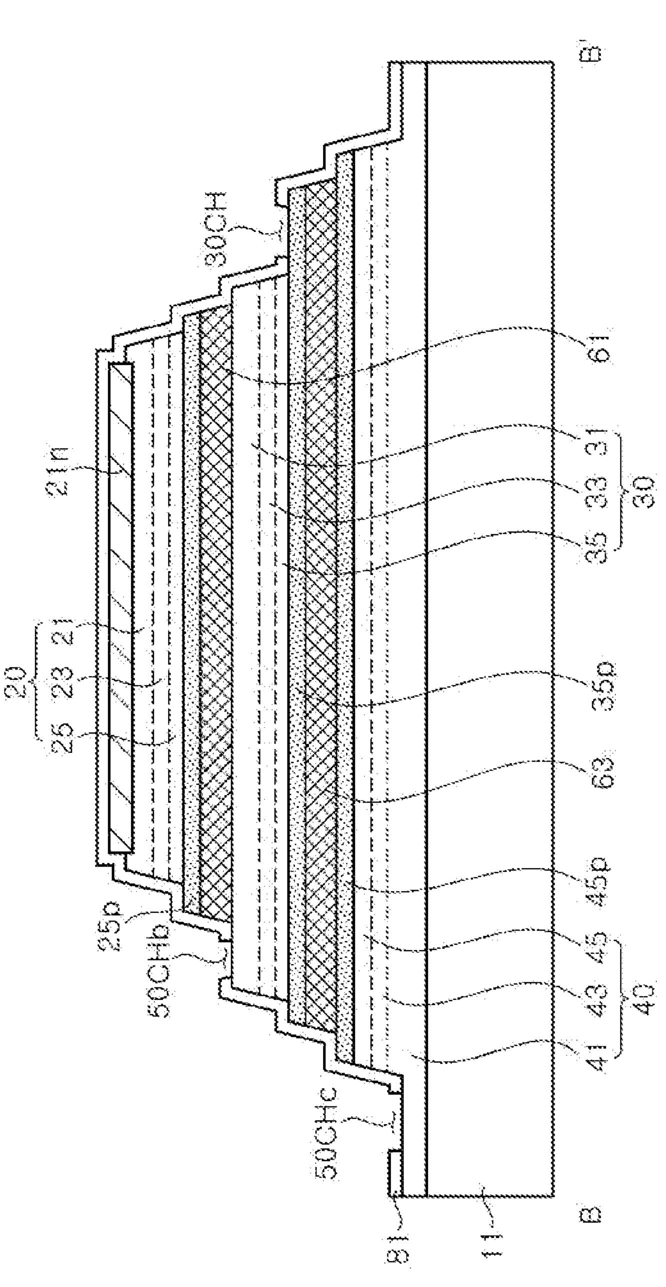

Referring to FIGS. 5A, 5B, and 5C, a first insulation layer 81 may be formed to cover the light emitting stacks 20, 30, and 40, and a portion of the first insulation layer 81 may be removed to form first, second, third, and fourth contact holes 20CH, 30CH, 40CH, and 50CH. The first contact hole 20CH is defined on the first lower contact electrode 25*p* to expose a portion of the first lower contact electrode 25*p*. The second contact hole 30CH is defined on the second lower contact electrode 35*p* and may expose the second lower contact electrode 35*p*. The third contact hole 40CH is defined on the third lower contact electrode 45*p* and may expose the third lower contact electrode 45*p*.

The fourth contact hole 50CH provides a passage for electrical connection to the first conductivity type semiconductor layers 21, 31, and 41 of the first, second, and third light emitting stacks 20, 30, and 40. The fourth contact hole 50CH may include a first sub-contact hole 50CHa, a second sub-contact hole 50CHb, and a third sub-contact hole 50CHc. The first sub-contact hole 50CHa may be defined on the first conductivity type semiconductor layer 21 to expose a portion of the first upper contact electrode 21*n*, and the second sub-contact hole 50CHb may be defined on the first conductivity type semiconductor layer 31 to expose a portion of the first conductivity type semiconductor layer 31, and the third sub-contact hole 50CHc may be defined on the first conductivity type semiconductor layer 41 to expose a portion of the first conductivity type semiconductor layer 41.

Figure 6A:
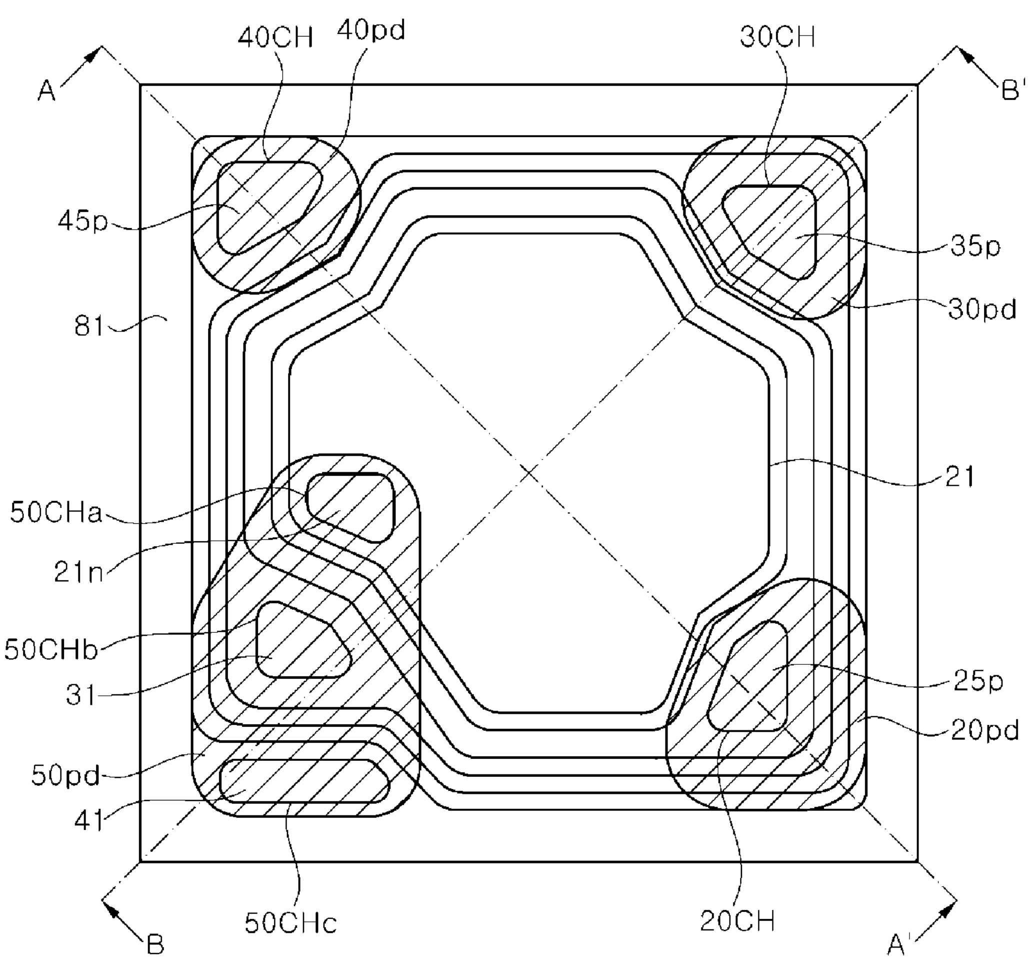
Figure 6B:
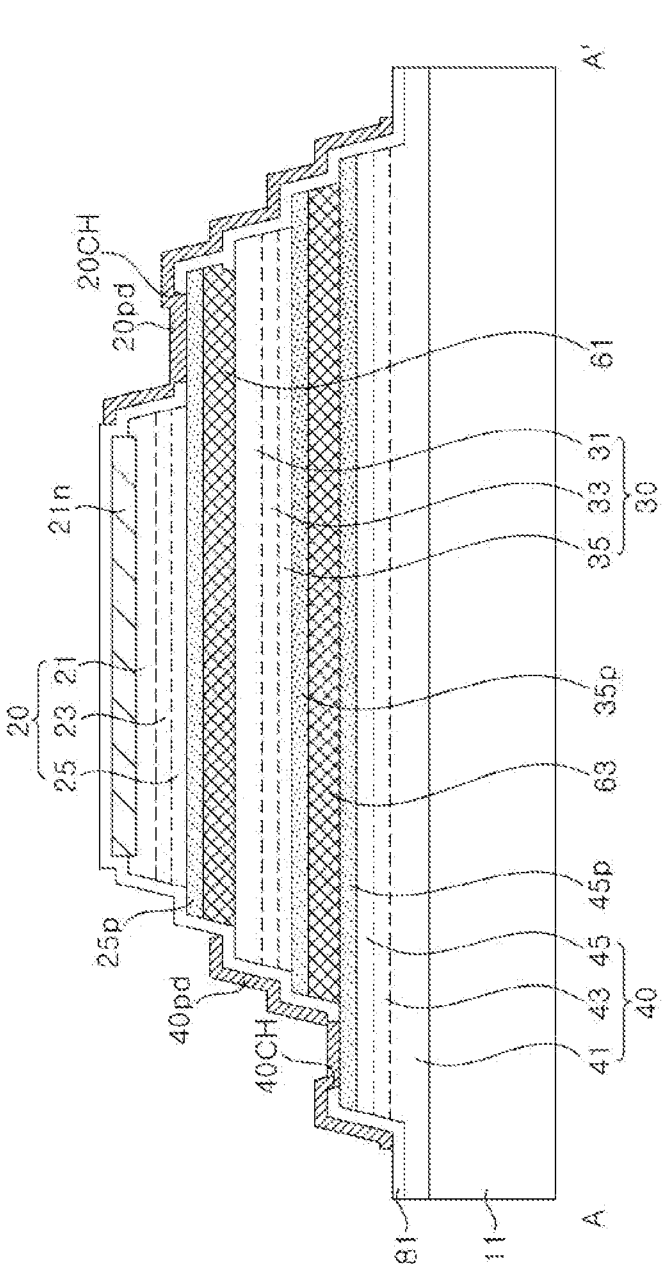
Figure 6C:
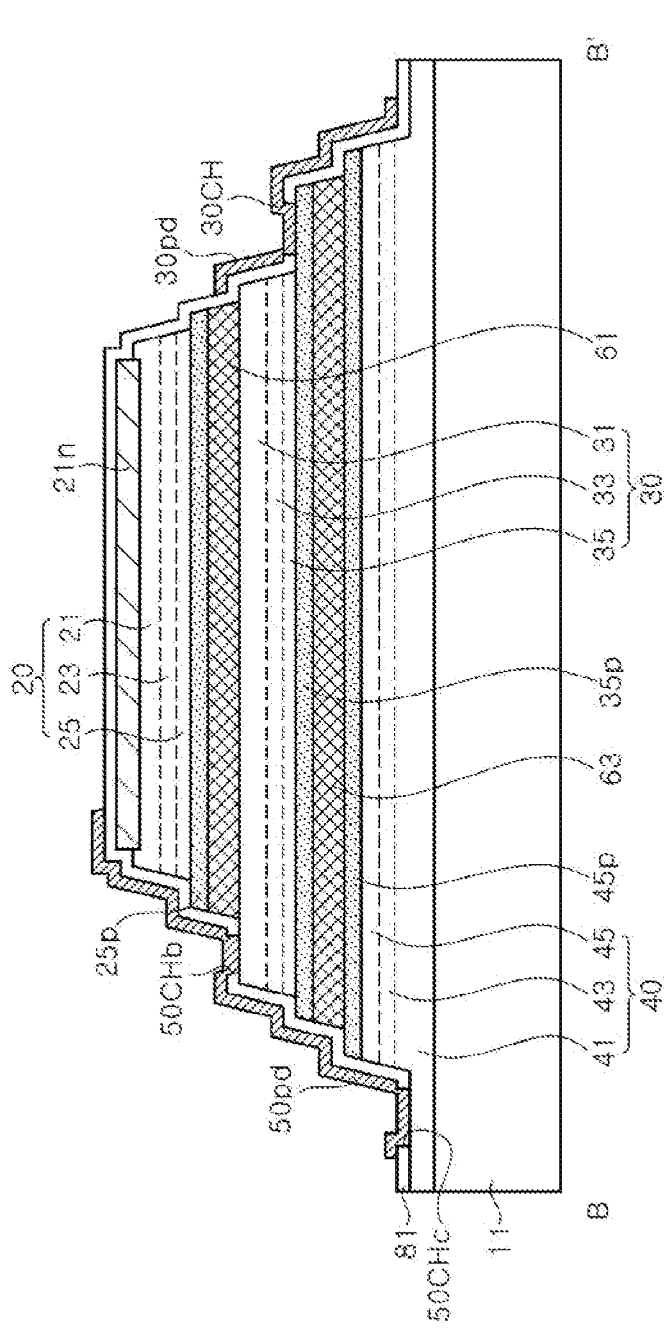

Referring to FIGS. 6A, 6B, and 6C, first, second, third, and fourth pads 20*pd*, 30*pd*, 40*pd*, and 50*pd* are formed on the first insulation layer 81 formed with the first, second, third, and fourth contact holes 20CH, 30CH, 40CH, and 50CH. The first, second, third, and fourth pads 20*pd*, 30*pd*, 40*pd*, and 50*pd* may be formed, for example, by forming a conductive layer on substantially the entire surface of the substrate 11, and by patterning the conductive layer using a photolithography process.

The first pad 20*pd* may be formed to overlap with a region where the first contact hole 20CH is formed, and may be connected to the first lower contact electrode 25*p* through the first contact hole 20CH. The second pad 30*pd* may be formed to overlap with a region where the second contact hole 30CH is formed, and may be connected to the second lower contact electrode layer 35*p* through the second contact hole 30CH. The third pad 40*pd* may be formed to overlap with a region where the third contact hole 40CH is formed, and may be connected to the third lower contact electrode 45*p* through the third contact hole 40CH. The fourth pad 50*pd* may be formed to overlap with a region where the fourth contact hole 50CH is formed, particularly regions where the first, second, and third sub-contact holes 50CHa, 50CHb, and 50CHc are formed, and may be electrically connected to the first conductivity type semiconductor layers 21, 31, and 41 of the light emitting stacks 20, 30, and 40.

Figure 7A:
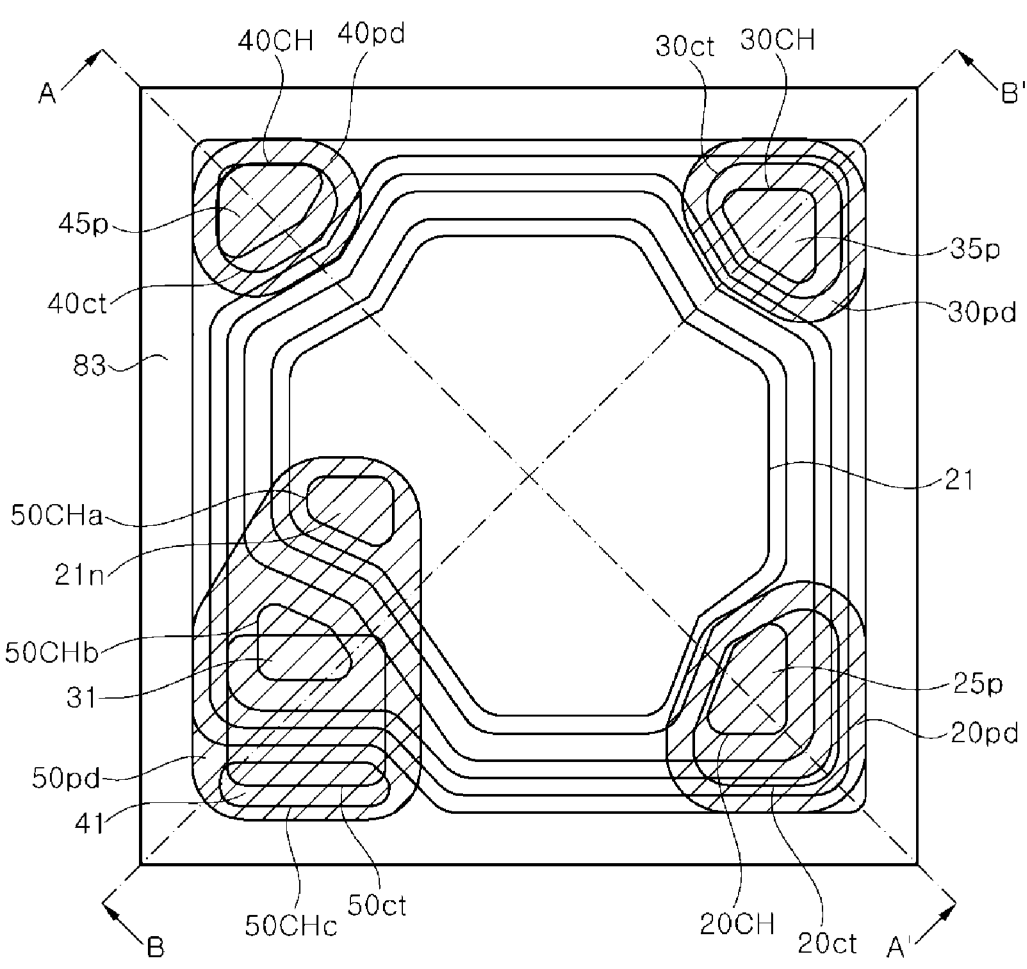
Figure 7B:
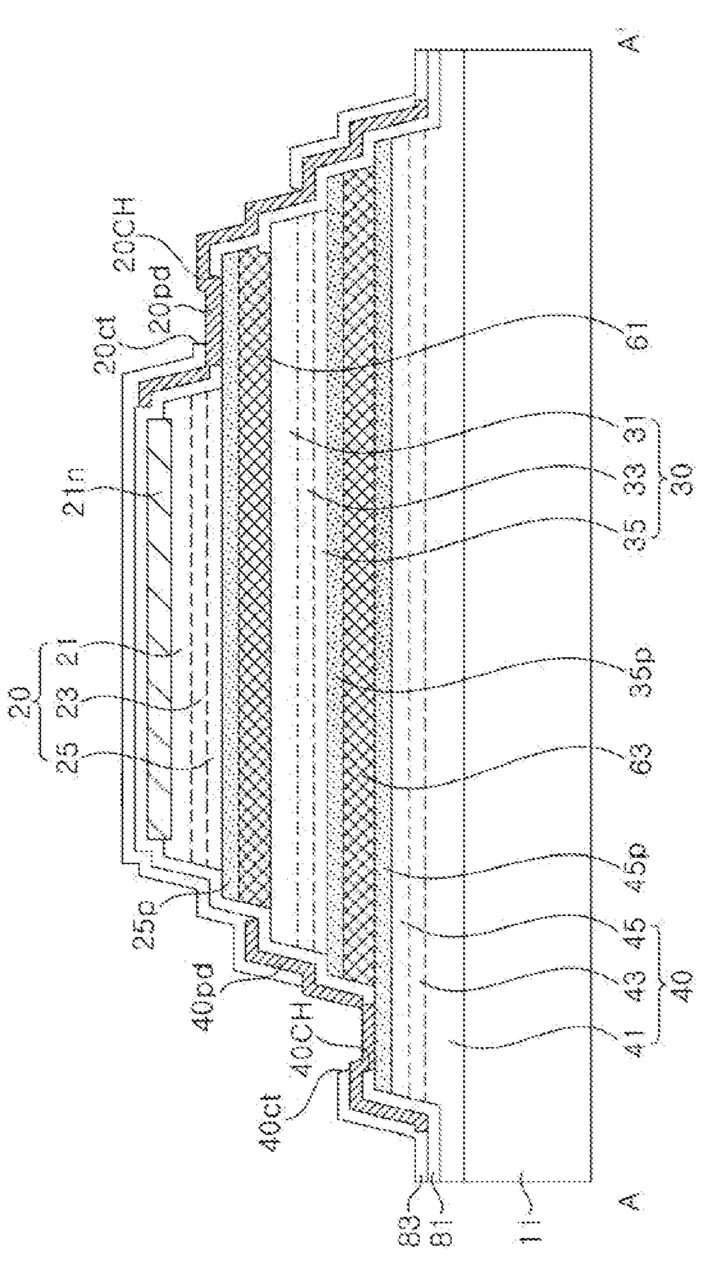
Figure 7C:
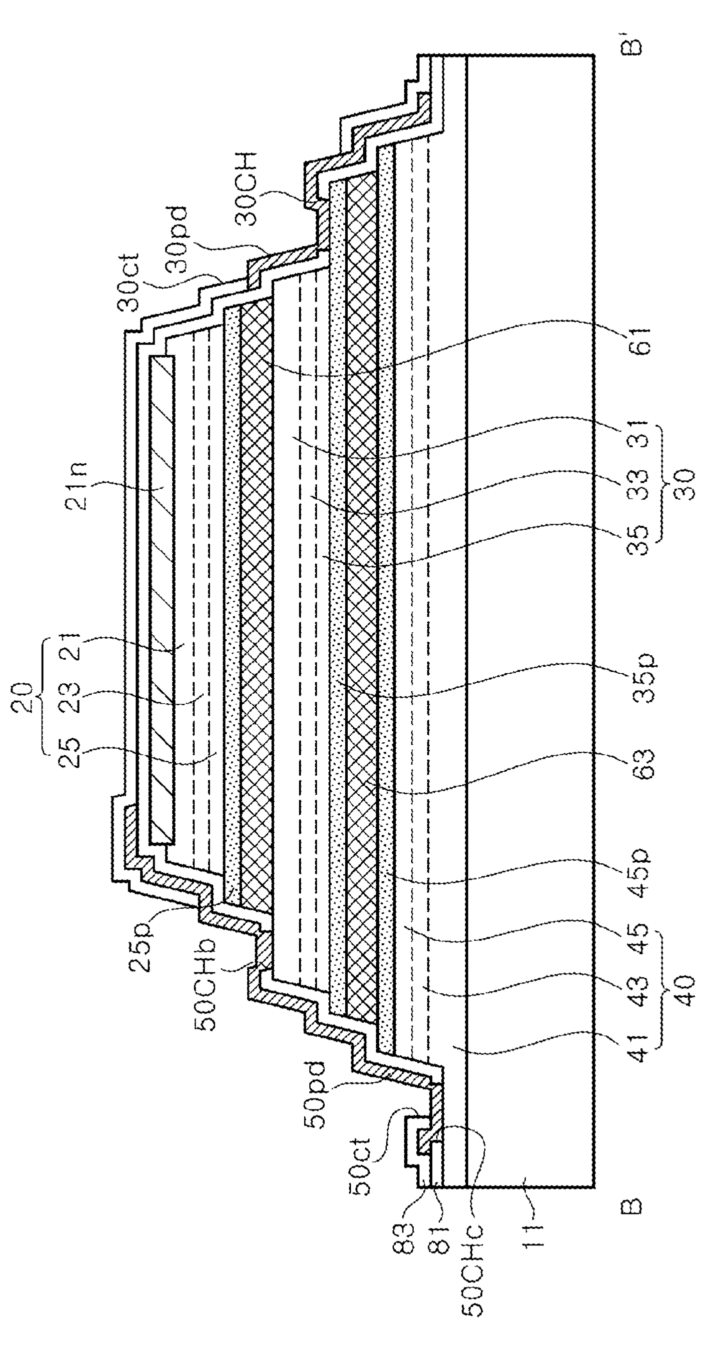

Referring to FIGS. 7A, 7B, and 7C, a second insulation layer 83 may be formed on the first insulation layer 81. The second insulation layer 83 may include silicon oxide and/or silicon nitride. However, the inventive concepts are not limited thereto, and in some exemplary embodiments, the first and second insulation layers 81 and 83 may include inorganic materials. Subsequently, the second insulation layer 83 may be patterned and first, second, third, and fourth through holes 20*ct*, 30*ct*, 40*ct*, and 50*ct* exposing the first, second, third, and fourth pads 20*pd*, 30*pd*, 40*pd*, and 50*pd* may be formed.

The first through hole 20*ct* formed on the first pad 20*pd* exposes a portion of the first pad 20*pd*. The second through hole 30*ct* formed on the second pad 30*pd* exposes a portion of the second pad 30*pd*. The third through hole 40*ct* formed on the third pad 40*pd* exposes a portion of the third pad 40*pd*. The fourth through hole 50*ct* formed on the fourth pad 50*pd* exposes a portion of the fourth pad 50*pd*. In the illustrated exemplary embodiment, the first, second, third, and fourth through holes 20*ct*, 30*ct*, 40*ct*, and 50*ct* may be defined within regions where the first, second, third, and fourth pads 20*pd*, 30*pd*, 40*pd*, and 50*pd* are formed, respectively.

Figure 8A:
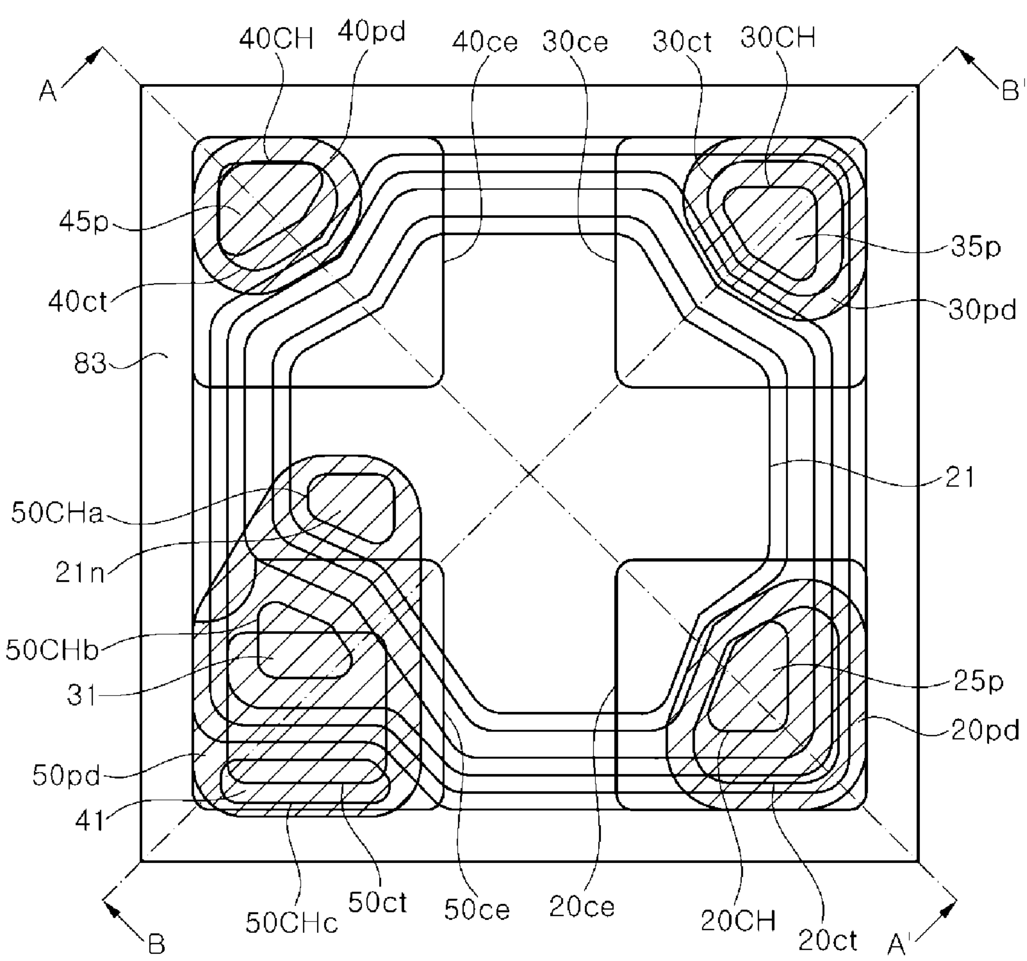
Figure 8B:
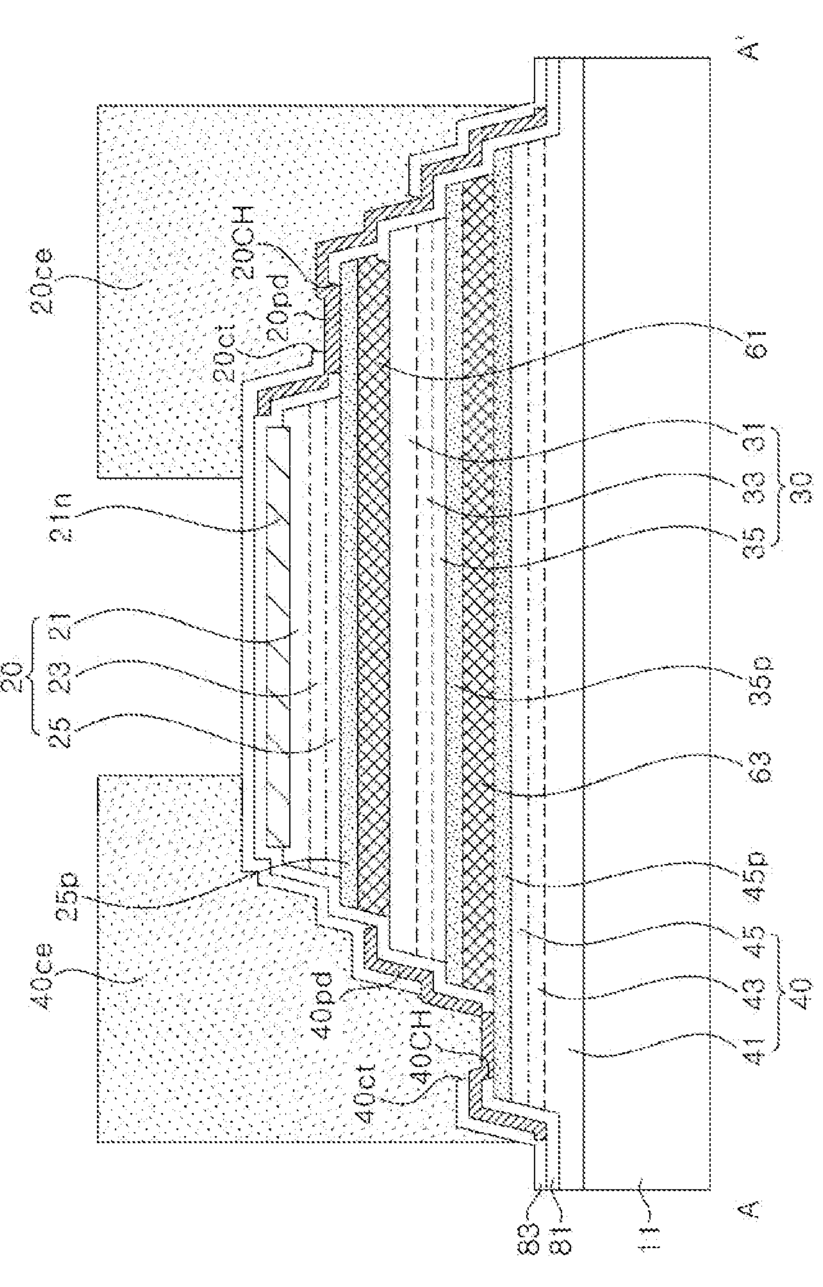
Figure 8C:
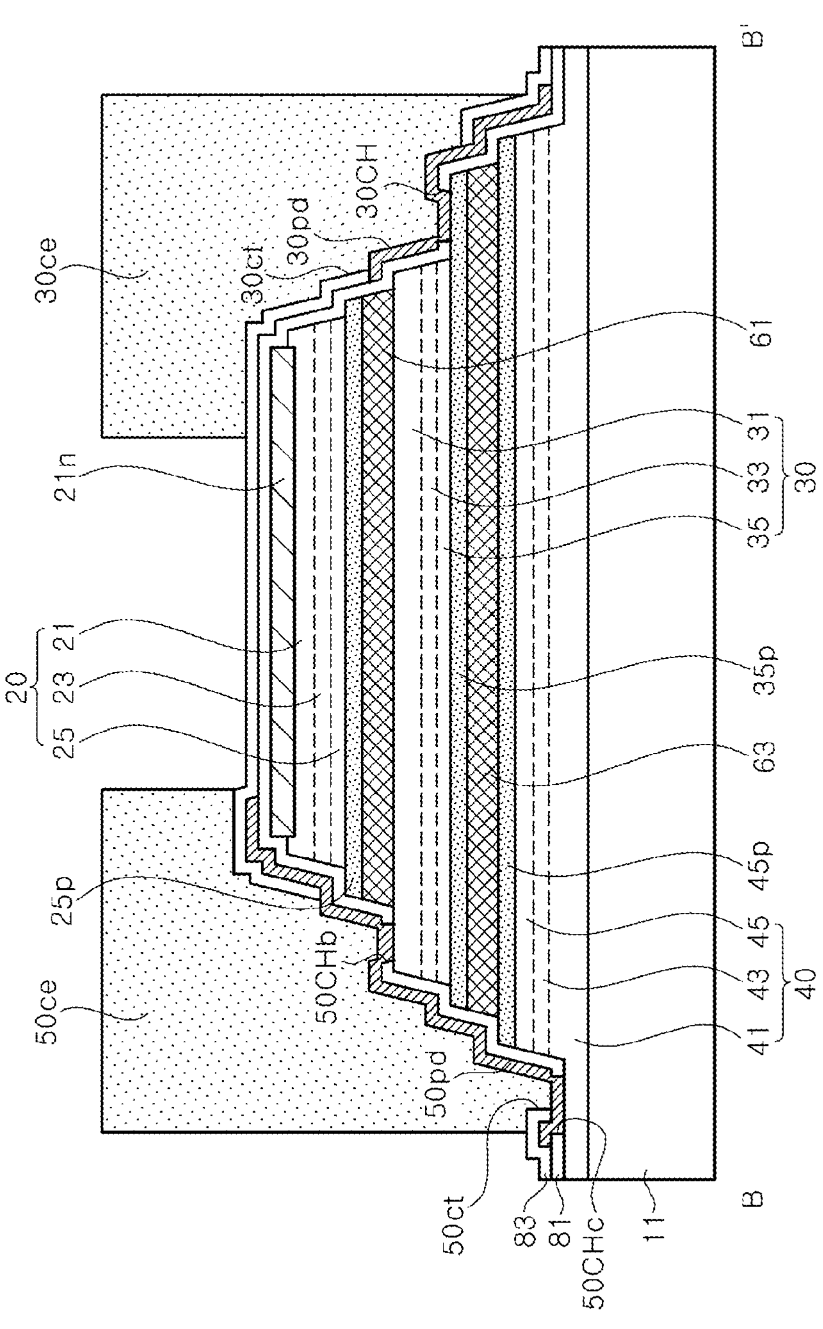

Referring to FIGS. 8A, 8B, and 8C, first, second, third and fourth connection electrodes 20*ce*, 30*ce*, 40*ce*, and 50*ce* are formed on the second insulation layer 83 on which the first, second, third and fourth through holes 20*ct*, 30*ct*, 40*ct*, and 50*ct* are formed. The first connection electrode 20*ce* may be formed to overlap with a region where the first through hole 20*ct* is formed, and may be connected to the first pad 20*pd* through the first through hole 20*ct*. The second connection electrode 30*ce* may be formed to overlap with a region where the second through hole 30*ct* is formed, and may be connected to the second pad 30*pd* through the second through hole 30*ct*. The third connection electrode 40*ce* may be formed to overlap with a region where the third through hole 40*ct* is formed, and may be connected to the third pad 40*pd* through the third through hole 40*ct*. The fourth connection electrode 50*ce* may be formed to overlap with a region where the fourth through hole 50*ct* is formed, and may be connected to the fourth pad 50*pd* through the fourth through hole 50*ct*.

The first, second, third, and fourth connection electrodes 20*ce*, 30*ce*, 40*ce*, and 50*ce* may be spaced apart from one another, and be formed on the light emitting stack structure. The first, second, third, and fourth connection electrodes 20*ce*, 30*ce*, 40*ce*, and 50*ce* may be electrically connected to the first, second, third, and fourth pads 20*pd*, 30*pd*, 40*pd*, and 50*pd*, respectively, and transmit an external signal to each of the light emitting stacks 20, 30, and 40.

A method of forming the first, second, third, and fourth connection electrodes 20*ce*, 30*ce*, 40*ce*, and 50*ce* is not particularly limited. For example, according to an exemplary embodiment, a seed layer is deposited as a conductive surface on the light emitting stack structure, and a photoresist pattern may be formed so that the seed layer is exposed at a location where connection electrodes will be formed. According to an exemplary embodiment, the seed layer may be deposited to have a thickness of about 1000 Å, but the inventive concepts are not limited thereto. Subsequently, the seed layer may be plated with metal, such as Cu, Ni, Ti, Sb, Zn, Mo, Co, Sn, Ag or an alloy thereof, and the photoresist pattern and the seed layer that remain between the connection electrodes may be removed. In some exemplary embodiments, to prevent or at least suppress oxidation of the plated metal, an additional metal may be deposited or plated with electroless nickel immersion gold (ENIG) or the like on the plated metal (for example, connection electrodes). In some exemplary embodiments, the seed layer may be retained on each of the connection electrodes 20*ce*, 30*ce*, 40*ce*, and 50*ce*.

According to the illustrated exemplary embodiment, each of the connection electrodes 20*ce*, 30*ce*, 40*ce*, and 50*ce* may have a substantially elongated shape and protrudes outwardly with respect to the substrate 11. In another exemplary embodiment, the connection electrodes 20*ce*, 30*ce*, and 40*ce* may include two or more metals or a plurality of different metal layers to reduce stress from the elongated shape of the connection electrodes 20*ce*, 30*ce*, 40*ce*, and 50*ce*. However, the inventive concepts are not limited to a specific shape of the connection electrodes 20*ce*, 30*ce*, 40*ce*, and 50*ce*, and in some exemplary embodiments, the connection electrode may have various shapes.

As shown in the drawings, each of the connection electrodes 20*ce*, 30*ce*, 40*ce*, and 50*ce* may have a substantially flat upper surface to facilitate electrical connection between the light emitting stack structure and outer lines or electrodes. The connection electrodes 20*ce*, 30*ce*, 40*ce*, and 50*ce* may be overlapped with at least one step formed on the side surface of the light emitting stack structure. In this manner, a lower surface of the connection electrode may have a larger contact area than an upper surface thereof, and thus, the light emitting device 100 including the connection electrodes 20*ce*, 30*ce*, 40*ce*, and 50*ce* along with a protection layer 90 may provide a more stable structure that is capable of withstanding various subsequent processes. In this case, a length L of one side surface of the connection electrodes 20*ce*, 30*ce*, 40*ce*, and 50*ce* that faces to the outside and a length L' of another surface that faces a center of the light emitting device 100 may be different. For example, a difference in lengths between two surfaces of the connection electrode opposite to each other may be about 3 μm to about 16 μm, without being limited thereto.

Then, the protection layer 90 is disposed between the connection electrodes 20*ce*, 30*ce*, 40*ce*, and 50*ce*. The protection layer 90 may be formed to be substantially flush with the upper surfaces of the connection electrodes 20*ce*, 30*ce*, 40*ce*, and 50*ce* by a polishing process or the like. According to an exemplary embodiment, the protection layer 90 may include a black epoxy molding compound (EMC), but the inventive concepts are not limited thereto. For example, in some exemplary embodiments, the protection layer 90 may include a photosensitive polyimide dry film (PID). In this manner, the protection layer 90 may provide a sufficient contact area to the light emitting device 100 not only to protect the light emitting structure from external impacts that may be applied during subsequent processes, but also to facilitate handling during a subsequent transferring step. In addition, the protection layer 90 may prevent light leakage from the side surface of the light emitting device 100 to prevent or at least to suppress interference of light emitted from adjacent light emitting devices 100.

Figure 9:
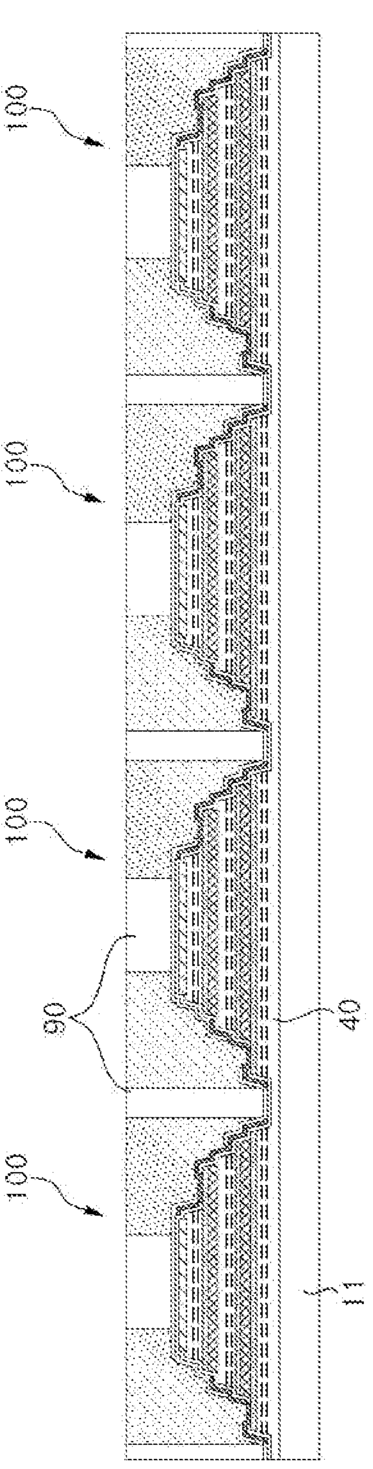
FIGS. 9, 10, 11, 12, and 13 are cross-sectional views schematically showing a process of manufacturing the light emitting device of FIG. 1A according to an exemplary embodiment.
Figure 10:
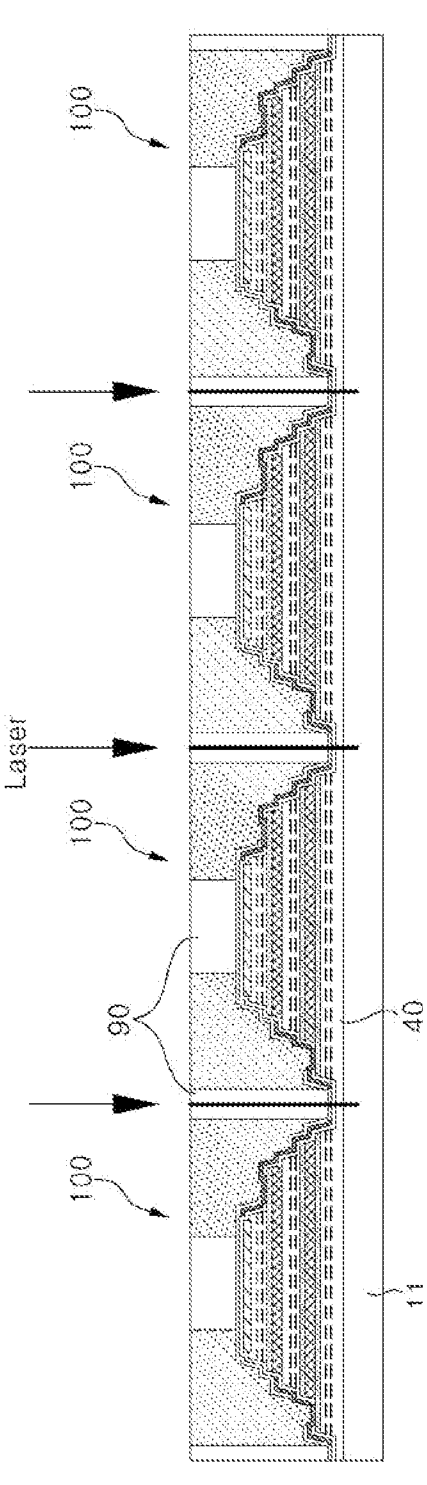
Figure 11:
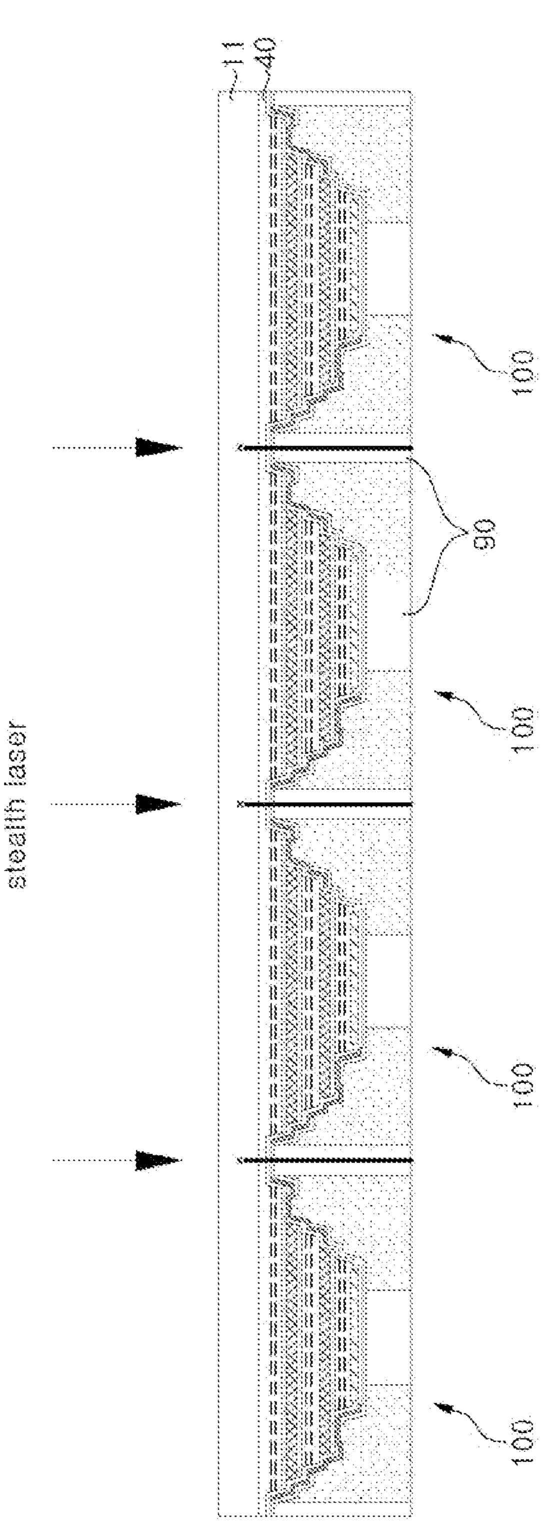

FIG. 9 exemplarily shows a plurality of light emitting devices 100 disposed on the substrate 11, which may be singularized to separate the light emitting devices 100. Referring to FIG. 10, according to an exemplary embodiment, laser beams may be irradiated between the light emitting stack structures to form a separation path that partially separates the light emitting stack structures. Referring to FIG. 11, a separation path may be added in the substrate 11 using a stealth laser. The stealth laser may be irradiated in a direction opposite to a surface to which the laser was irradiated in the process shown in FIG. 10.

Figure 12:
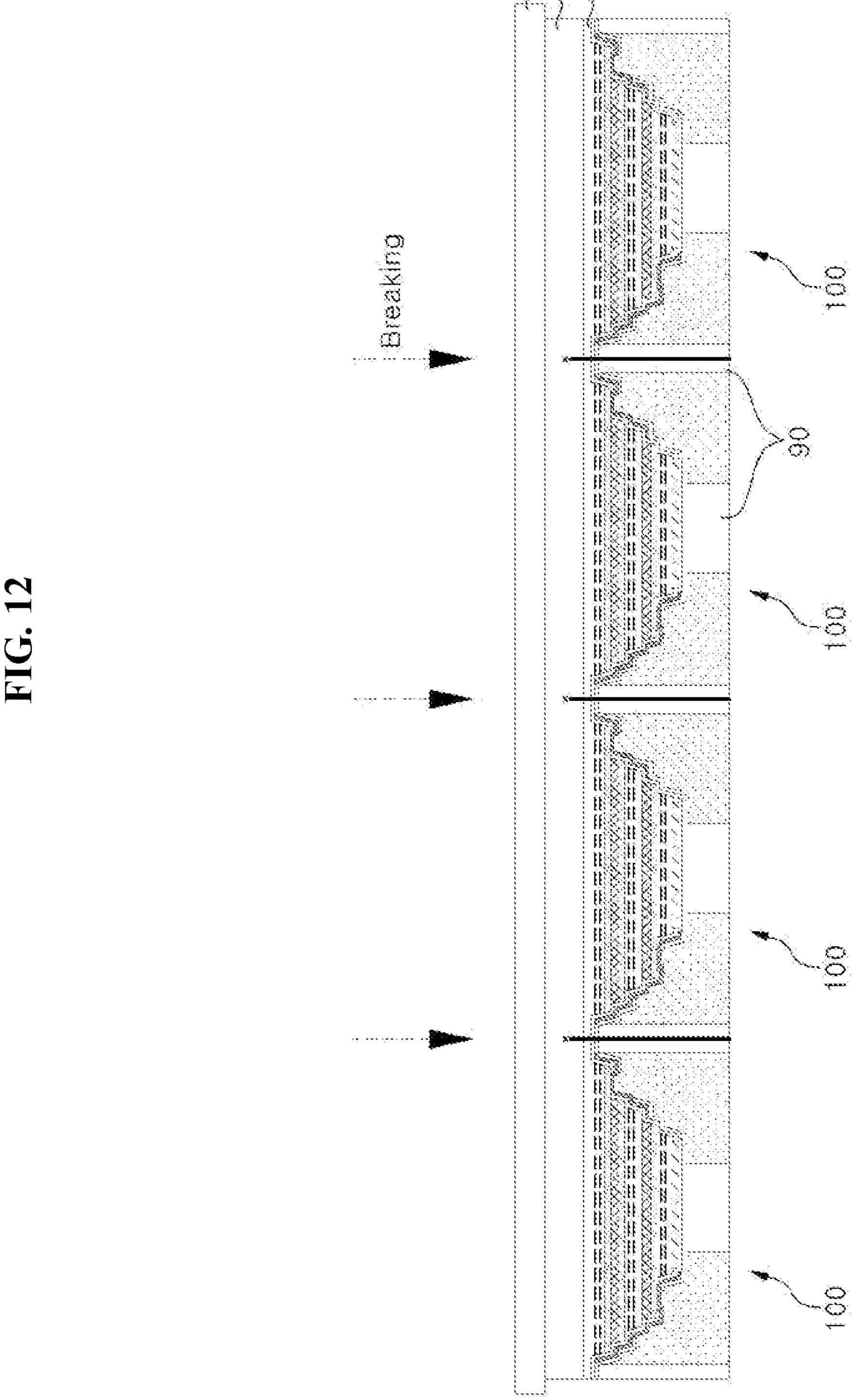

Referring to FIG. 12, the substrate 11 may be coupled to a first bonding layer 95, and the substrate 11 may be cut or broken using various methods that are well known in the art to singularize each of the light emitting devices 100. For example, the substrate 11 may be cut by dicing the substrate 11 through a scribing line formed thereon, or may be broken by applying a mechanical force along the separation path formed during a laser radiation process. The first bonding layer 95 may be a tape, but the inventive concepts are not limited thereto, as long as the first bonding layer 95 may stably attach the light emitting device 100 while being capable of separating the light emitting devices 100 therefrom in a subsequent process. Although the first bonding layer 95 has been described above as being attached on the substrate 11 after the laser radiation step, the first bonding layer 95 may be attached on the substrate 11 before the laser radiation step, in some exemplary embodiments.

Figure 13:
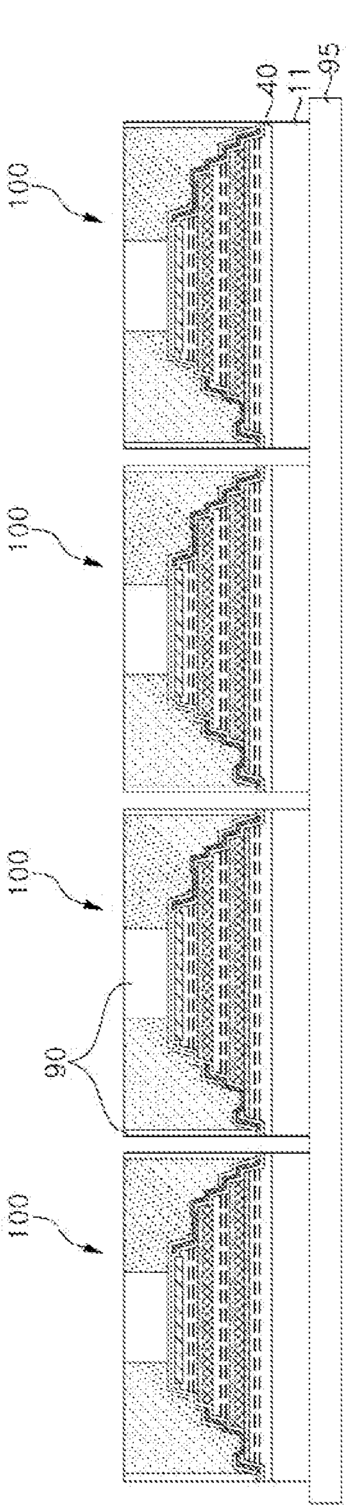

Referring to FIG. 13, after the substrate 11 is separated into individual light emitting devices 100, the first bonding layer 95 may be expanded, and accordingly, the light emitting devices 100 may be spatially spaced apart from one another.

Figure 14:
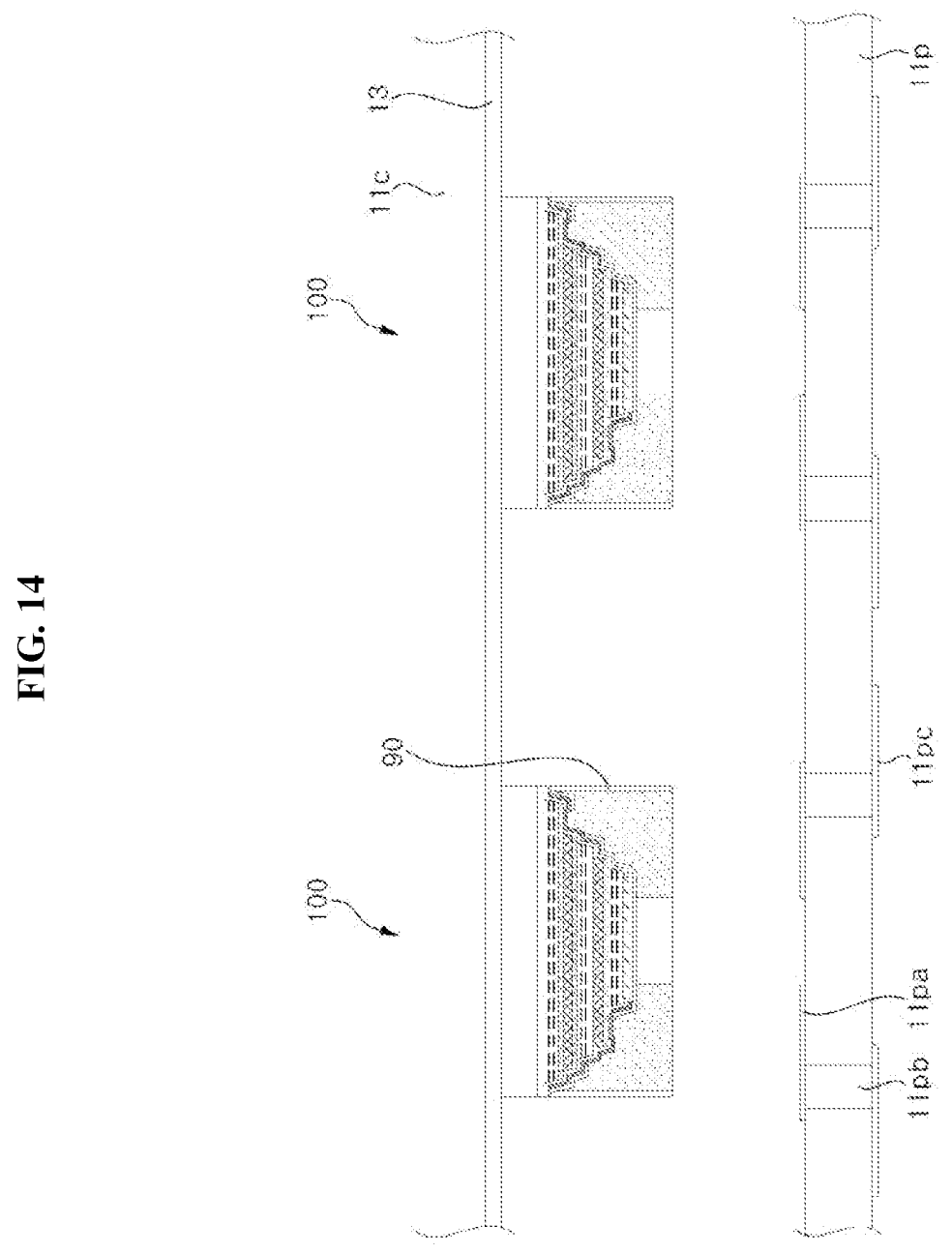
Figure 15:
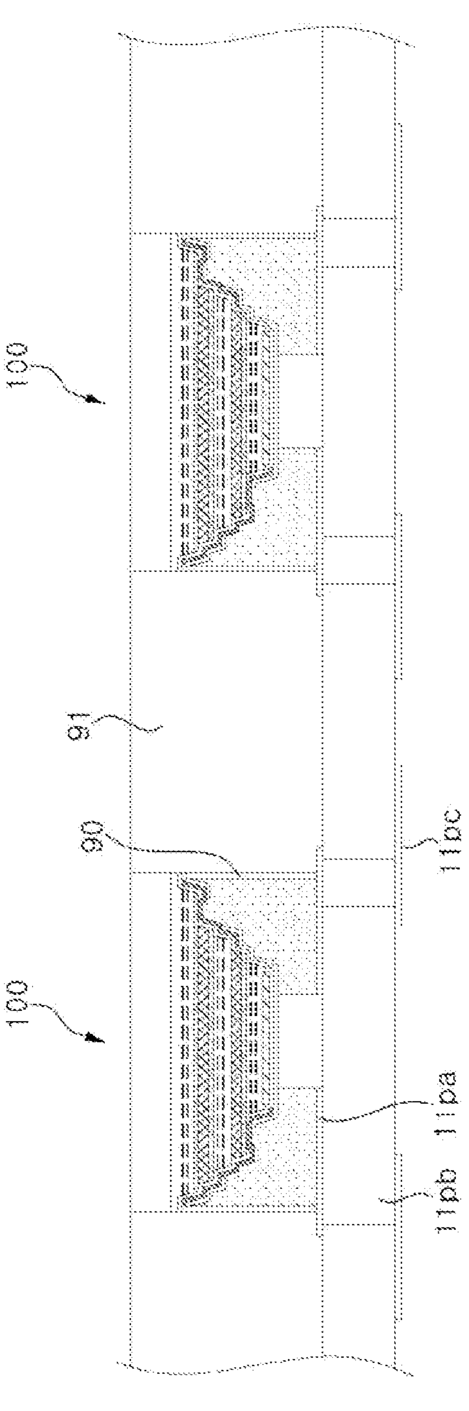

FIGS. 14, 15, and 16 are cross-sectional views schematically illustrating a process of manufacturing a light emitting package according to an exemplary embodiment. The light emitting device 100 according to an exemplary embodiment may be transferred and packaged in various ways known in the art. Hereinafter, the substrate 11 is exemplarily described as being attached to a second adhesive layer 13 using a carrier substrate 11*c* to transfer the light emitting device 100, but the inventive concepts are limited to a specific transfer method.

Referring to FIG. 14, according to an exemplary embodiment, the singularized light emitting device 100 may be transferred to the carrier substrate 11*c* with the second adhesive layer 13 therebetween. In this case, when the light emitting device 100 includes only the connection electrodes that protrude outwardly from the light emitting stack structure, various problems may occur in subsequent processes, particularly in a transfer process, due to the non-uniformed structure as described above. In addition, when the light emitting device 100 includes micro-LEDs having a surface area of about 10,000 $\mu m^2$ or less, of about 4,000 $\mu m^2$ or less, or about 2,500 $\mu m^2$ or less, depending on the application, handling of the light emitting device may be more difficult due to its small form factor. However, according to the exemplary embodiments, since the light emitting device 100 is provided with the protection layer 90 disposed between the connection electrodes 20*ce*, 30*ce*, 40*ce*, and 50*ce*, handling of the light emitting device 100 may be facilitated during subsequent processes such as transfer and packaging, and also, the light emitting structure may be protected from external impact, and interference of light between adjacent light emitting devices 100 may be prevented.

The carrier substrate 11*c* is not particularly limited as long as the carrier substrate 11*c* stably mounts the light emitting device 100 thereon with the second adhesive layer 13. The second adhesive layer 13 may be a tape, but the inventive concepts are not limited thereto, as long as the second adhesive layer 13 stably attaches the light emitting device 100 to the carrier substrate 11*c*, and the light emitting device 100 can be separated during subsequent processes. In some exemplary embodiments, the light emitting device 100 of FIG. 13 may not be transferred to a separate carrier substrate 11*c*, but may be directly transferred to a circuit board 11*p*.

The light emitting device 100 may be mounted on the circuit board 11*p*. According to an exemplary embodiment, the circuit board 11*p* may include an upper circuit electrode 11*pa*, a lower circuit electrode 11*pc*, and an intermediate circuit electrode 11*pb* that are electrically connected to one another. The upper circuit electrodes 11*pa* may correspond to each of the first, second, third, and fourth connection electrodes 20*ce*, 30*ce*, 40*ce*, and 50*ce*, respectively. In some exemplary embodiments, since the upper circuit electrodes 11*pa* are surface-treated by ENIG, and are partially melt at a high temperature, electrical connection to the connection electrodes of the light emitting device 100 may be facilitated.

According to the illustrated exemplary embodiment, the light emitting devices 100 may be spaced apart from one another on the carrier substrate 11*c* at a desired pitch in consideration of a pitch (P, see FIG. 16B) of the upper circuit electrode 11*pa* of the circuit board 11*p*, which will be mounted on a final target device, such as a display apparatus.

According to an exemplary embodiment, the first, second, third, and fourth connection electrodes 20*ce*, 30*ce*, 40*ce*, and 50*ce* of the light emitting device 100 may be bonded to the upper circuit electrodes 11*pa* of the circuit board 11*p*, respectively, by anisotropic conductive film (ACF) bonding, for example. When the light emitting device 100 is bonded to the circuit board through ACF bonding, which may be performed at a lower temperature than other bonding methods, the light emitting device 100 may be prevented from being exposed to a high temperature while bonding. However, the inventive concepts are not limited to a specific bonding method. For example, in some exemplary embodiments, the light emitting devices 100 may be bonded to the circuit board 11*p* using anisotropic conductive paste (ACP), solder, a ball grid array (BGA), or a micro bump including at least one of Cu and Sn. In this case, since the upper surfaces of the connection electrodes 20*ce*, 30*ce*, 40*ce*, and 50*ce* and the protection layer 90 are substantially flush with one another by a polishing process or the like, adhesion of the light emitting device 100 to the anisotropic conductive film may be increased, thereby providing a more stable structure while being bonded to the circuit board 11*p*.

Referring to FIG. 15, a molding layer 91 is formed between the light emitting devices 100. According to an exemplary embodiment, the molding layer 91 may block light by reflecting or absorbing light emitted from the light emitting device 100. The molding layer 91 may be flush with the upper surface of the light emitting device 100, that is, the light emission surface, and accordingly, a viewing angle of light emitted from the first, second, and third light emitting stacks 20, 30, and 40 may be reduced. For example, the molding layer 91 may cover a side surface of the substrate 11 and be flush with an upper surface of the substrate 11. Therefore, the molding layer 91 may prevent light from being emitted to the side surface of the substrate 11 to reduce the viewing angle. Moreover, since the light emission surface is limited to the upper surface of the substrate 11, viewing angles of light emitted from the first, second, and third light emitting stacks 20, 30, and 40 may be substantially the same. In addition, the molding layer 91, along with the protection layer 90 formed on the light emitting device 100, may strengthen the structure of the light emitting device 100, and thus, additional protection to the light emitting package may be provided. As the molding layer 91 is disposed between the adjacent light emitting devices 100, the protection layers 90 are disposed at both sides between adjacent connection electrodes with the molding layer 91 interposed therebetween.

In an exemplary embodiment, the molding layer 91 may include an organic or inorganic polymer. In some exemplary embodiments, the molding layer 91 may further include fillers, such as silica or alumina. In other exemplary embodiments, the molding layer 91 may include the same material as the protection layer 90. The molding layer 91 may be formed through various methods known in the art, such as lamination, plating and/or printing methods. For example, the molding layer 91 may be formed by a vacuum lamination process, in which an organic polymer sheet is disposed on the light emitting device 100 and subjected to a high temperature and a high pressure in vacuum, and thus, a substantially flat upper surface of the light emitting package may be provided, thereby improving uniformity of light. The molding layer 91 may be partially removed to expose the upper surface of the light emitting device 100 through a grinding process or an entire surface etching process.

In some exemplary embodiments, the substrate 11 may be removed from the light emitting device 100 before the molding layer 91 is formed. In this case, the molding layer 91 may cover a side surface of the first conductivity type semiconductor layer 41 and expose an upper surface of the first conductivity type semiconductor layer 41.

Figure 16A:
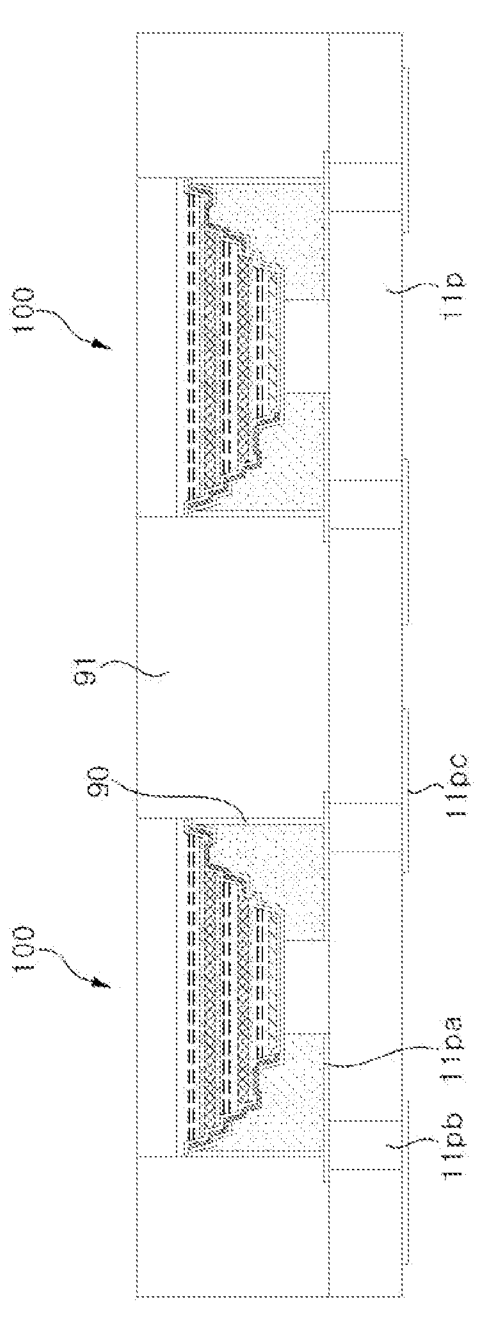
Figure 16B:
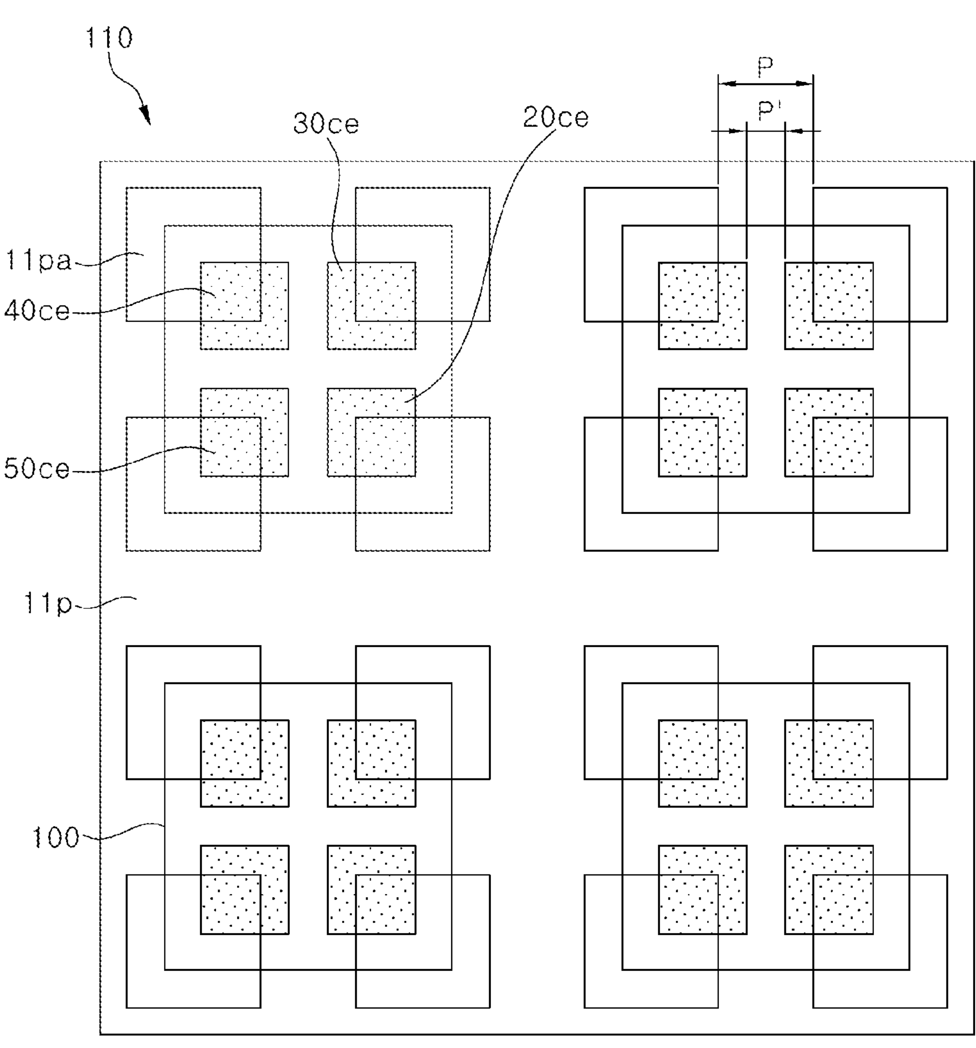
FIG. 16B is a plan view of a light emitting package according to an exemplary embodiment.

Referring to FIGS. 16A and 16B, the light emitting device 100 disposed on the circuit board 11*p* may be cut into a desired configuration and formed as a light emitting package 110. FIG. 16B includes four light emitting devices 100 (2×2) disposed on the circuit board 11*p*. However, the inventive concepts are not limited to a specific number of light emitting devices formed in the light emitting package 110. For example, in some exemplary embodiments, the light emitting package 110 may include one or more light emitting devices 100 formed on the circuit board 11*p*. In addition, the inventive concepts are not limited to a specific arrangement of one or more light emitting devices 100 in the light emitting package 110, and for example, one or more light emitting devices 100 in the light emitting package 110 may be arranged in an n×m-arrangement, in which n and m refer to natural numbers. According to an exemplary embodiment, the circuit board 11*p* may include a scan line and a data line to independently drive each of the light emitting devices 100 included in the light emitting package 110.

Figure 17:
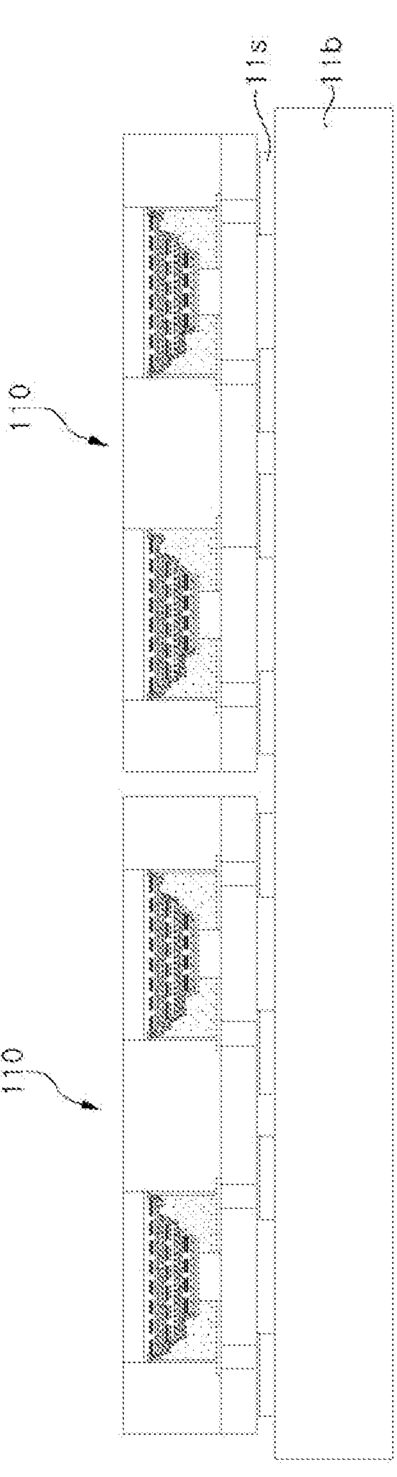
FIG. 17 is a schematic cross-sectional view illustrating a display apparatus according to an exemplary embodiment.

FIG. 17 is a schematic cross-sectional view illustrating a display apparatus according to an exemplary embodiment.

Referring to FIG. 17, the display apparatus may include a display substrate 11*b* and a light emitting package 110. The light emitting package 110 may be mounted on the display substrate 11*b*, which may be a final apparatus, such as a display apparatus. The display substrate 11*b* may include target electrodes 11*s* that correspond to the lower circuit electrodes 11*pc* of the light emitting package 110, respectively. The display apparatus according to an exemplary embodiment may include a plurality of pixels, and each of the light emitting devices 100 may be disposed to correspond to each pixel. More specifically, each light emitting stack of the light emitting devices 100 according to an exemplary embodiment may correspond to each sub-pixel of one pixel. Since the light emitting devices 100 include the light emitting stacks 20, 30, and 40 that are vertically stacked, the number of devices to be transferred for each sub-pixel may be substantially reduced as compared to those in conventional light emitting devices. In addition, since surfaces of connection electrodes opposite to each other have different lengths from each other, the connection electrodes may be stably formed in the light emitting stack structure to strengthen an internal structure thereof. In addition, since the light emitting devices 100 according to an exemplary embodiment include a protection layer 90 between the connection electrodes, the light emitting devices 100 may be protected from an external impact.

In the illustrated exemplary embodiment, although the light emitting package 110 is described as being mounted on the display substrate 11*b*, the process of manufacturing the light emitting package 110 may be omitted, and the light emitting devices 100 may be directly mounted on the display substrate 11*b* and a molding layer 91 may be formed thereafter.

Figure 18:
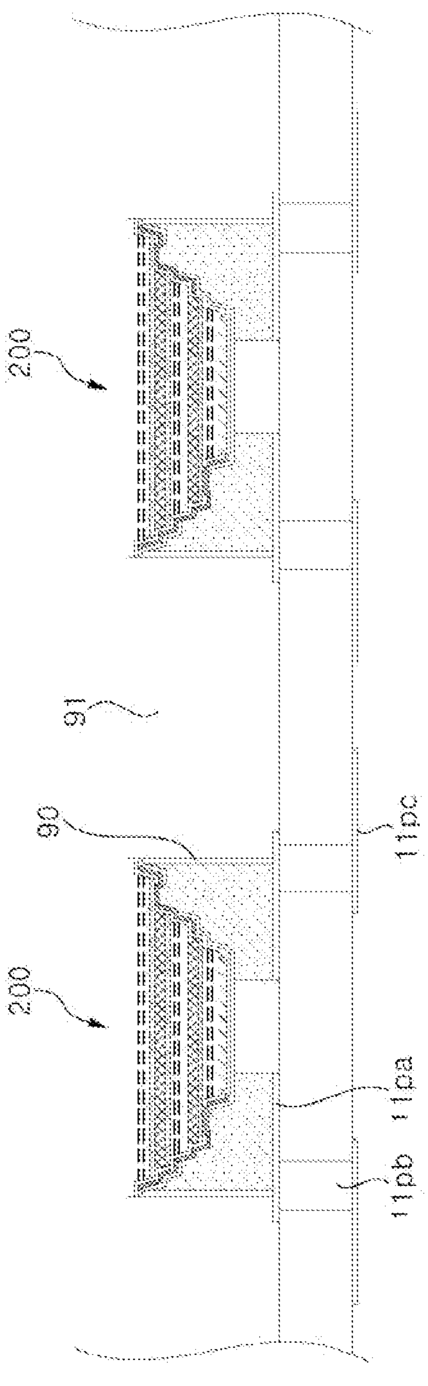
FIG. 18 is a schematic cross-sectional view illustrating a light emitting package according to another exemplary embodiment.

FIG. 18 is a schematic cross-sectional view illustrating a light emitting package according to another exemplary embodiment.

Referring to FIG. 18, the light emitting package according to an exemplary embodiment is substantially similar to that described with reference to FIGS. 15, 16A, and 16B, but a light emitting device 200 according to the illustrated exemplary embodiment does not include the substrate 11. The substrate 11 is removed from the light emitting device 100, and thus, a first conductivity type semiconductor layer 41 is exposed. The light emitting device 200 emits light through an upper surface of the first conductivity type semiconductor layer 41, and thus, the upper surface of the first conductivity type semiconductor layer 41 may be the light emission surface. A molding layer 91 covers a side surface of the first conductivity type semiconductor layer 41 and exposes the upper surface thereof.

Figure 19A:
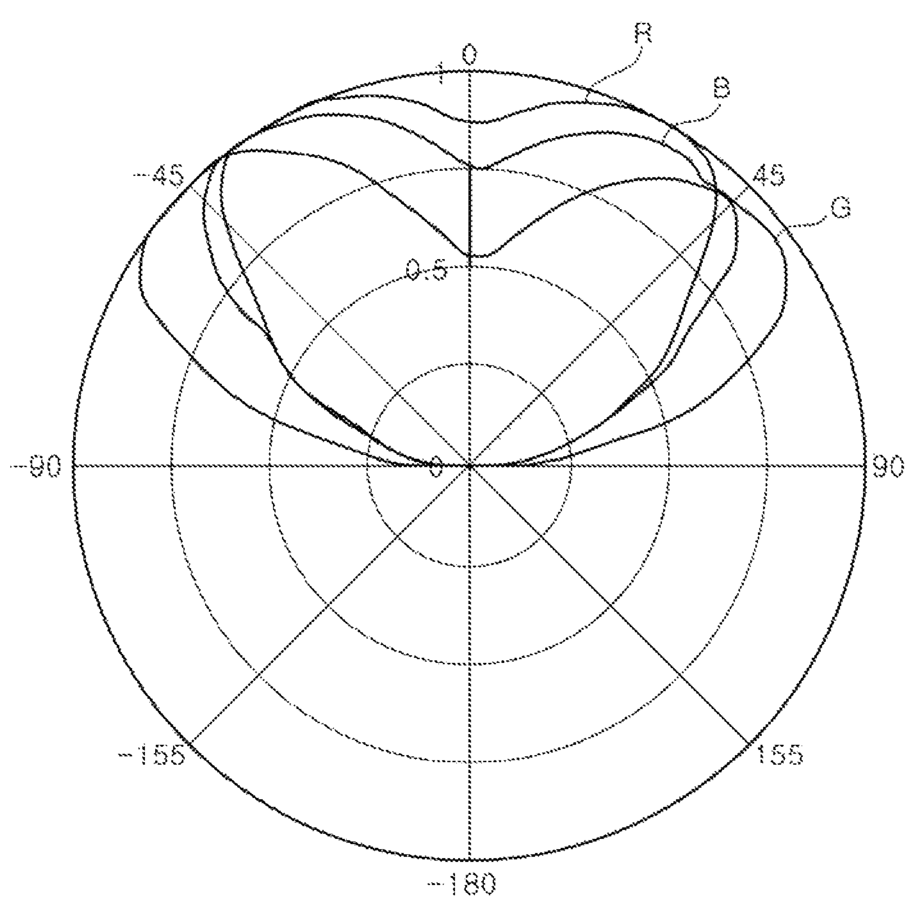
FIG. 19A is a graph showing viewing angles of a conventional light emitting device not including a molding layer.
Figure 19B:
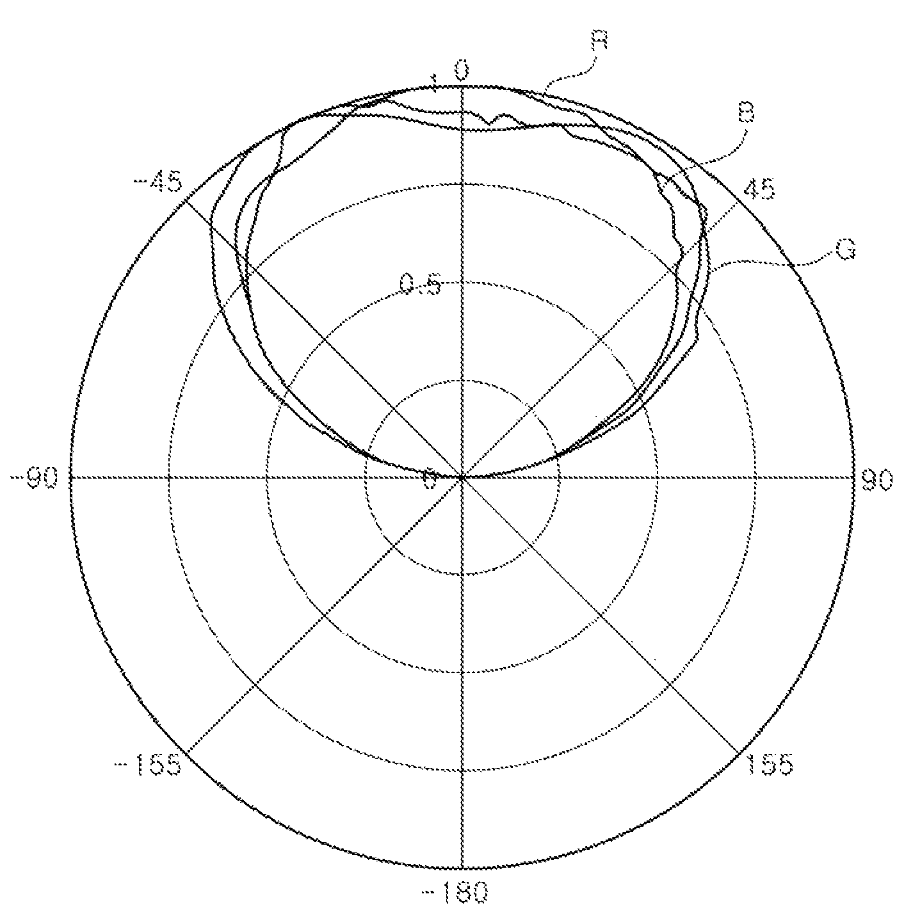
FIG. 19B is a graph showing viewing angles of a light emitting device including a transparent molding layer according to an exemplary embodiment.
Figure 19C:
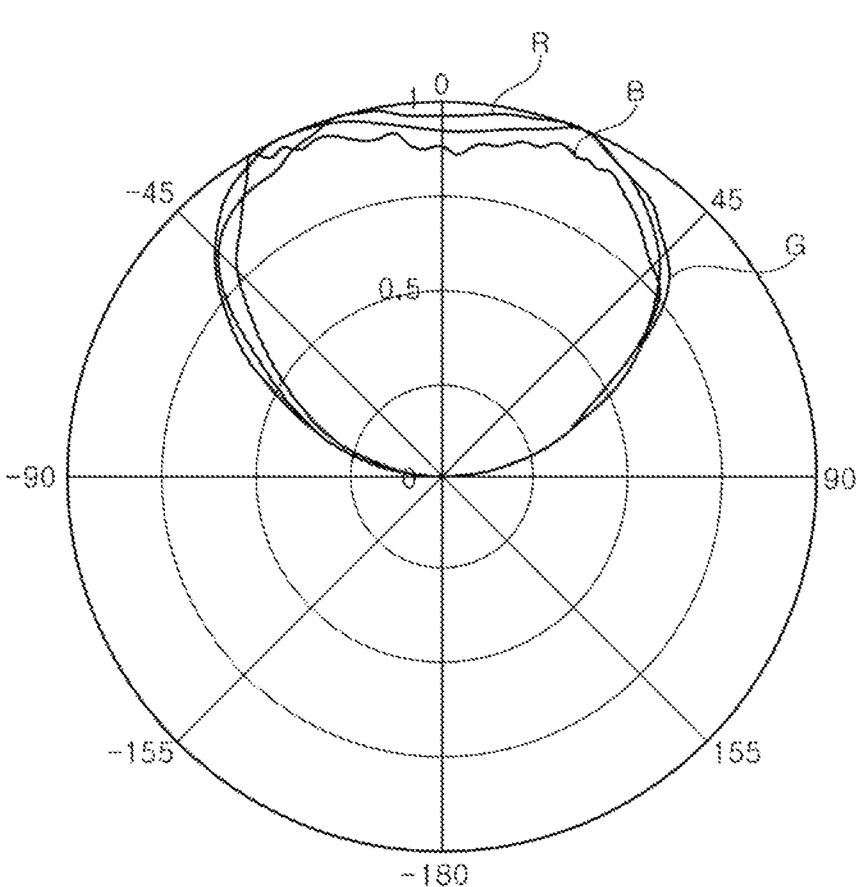
FIG. 19C is a graph showing viewing angles of a light emitting device including a black molding layer according to an exemplary embodiment.

FIG. 19A is a graph showing viewing angles of a conventional light emitting device that does not include a molding layer, FIG. 19B is a graph showing viewing angles of a light emitting device including a transparent molding layer according to an exemplary embodiment, and FIG. 19C is a graph showing viewing angles of a light emitting device including a black molding layer according to an exemplary embodiment.

Referring to FIG. 19A, when a molding layer 91 is not used, viewing angles of red light R, green light G, and blue light B emitted from the light emitting device 100 are significantly different from one another. In particular, it can be seen that the viewing angle of green light G emitted from the third light emitting stack 40 disposed closer to a light emitting surface is the largest. More specifically, the viewing angle of red light was about 125.7, the viewing angle of blue light B was about 128.8, and the viewing angle of green light G was about 155.6. The viewing angle of green light G was about 30 degrees greater than that of red light R or blue light B.

Referring to FIG. 19B, even when a transparent molding layer 91 is included, it can be seen that all of the viewing angles of red light R, green light G, and blue light B decrease compared to those of FIG. 19A. Moreover, it can be seen that a difference between the viewing angles of red light R, green light G, and blue light B is reduced as the viewing angle of green light G is further reduced. More specifically, the viewing angle of red light was about 128.3, the viewing angle of blue light B was about 126.4, and the viewing angle of green light G was about 135.2. The viewing angle of green light G did not exceed about 10 degrees compared to that of red light R or blue light B.

Referring to FIG. 19C, when a black molding layer 91 is included, it can be seen that all of the viewing angles of red light R, green light G, and blue light B are further reduced compared to those of FIG. 19B. Moreover, it can be seen that a difference between the viewing angles of red light R, green light G, and blue light B is further reduced. More specifically, the viewing angle of red light is about 124.2, the viewing angle of blue light B is about 119.0, and the viewing angle of green light G is about 126.5. The viewing angle of green light G did not exceed about 10 degrees compared to that of the red light R or blue light B.

According to exemplary embodiments, since the first, second, and third LED sub-units overlap with one another, an area of each sub-pixel within a restricted pixel area may be increased without increasing the pixel area. Furthermore, since the light emitting device includes the first, second, and third LED sub-units, the number of light emitting devices may be reduced compared to conventional light emitting devices, and accordingly, a time associated with a mounting process of light emitting devices may be reduced.

In addition, since the molding layer covers the side surface of the light emitting device and exposes the upper surface thereof, a viewing angle of light emitted from the first, second, and third light emitting stacks may be reduced, and furthermore, the viewing angle of light emitted from the first, second, and third light emitting stacks may become substantially the same as each other.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device, comprising:
- a support substrate;
- a plurality of light emitters disposed on the support substrate, each of the light emitters including:
  - a first type layer;
  - a second type layer disposed on the first type layer; and
  - a third type layer disposed on the second type layer;
- a plurality of light transparent insulators, each of which is disposed over a respective one of the plurality of light emitters; and
- a contiguous polymer layer disposed between adjacent light emitters of the plurality of light emitters, wherein
- the contiguous polymer layer has partially removed regions to expose an upper surface of each of the light emitters,
- each of the light transparent insulators is disposed in a region corresponding to each respective one of the partially removed regions, and
- a top surface of each of the light transparent insulators is higher than a top surface of each respective one of the light emitters, each respective one of the light emitters being disposed between the support substrate and the corresponding light transparent insulator, a lowest surface of each of the light transparent insulators being higher than a bottom surface of the first type layer of each respective one of the light emitters.

2. The light emitting device of claim 1, wherein the contiguous polymer layer reflects light emitted from the light transparent insulators.

3. The light emitting device of claim 1, wherein a viewing angle of light reflected by the contiguous polymer layer is different from a viewing angle of light emitted from the light transparent insulators.

4. The light emitting device of claim 1, wherein
- each of the light emitters further includes:
  - a first electrode electrically connected to the first type layer; and
  - a second electrode electrically connected to the third type layer, and
- the first electrode and the second electrode are positioned corresponding to the partially removed regions.

5. The light emitting device of claim 1, wherein the light emitters are positioned corresponding to the partially removed regions.

6. The light emitting device of claim 1, wherein each of the light transparent insulators has a pattern for increasing extraction efficiency of light generated from the second type layer.

7. The light emitting device of claim 1, wherein the light emitters are arranged in an n×m arrangement, in which n and m are natural numbers.

8. A light emitting device, comprising:

a support substrate;

a plurality of light emitters disposed on the support substrate, each of the light emitters including:

a first type layer including gallium;

a second type layer disposed on the first type layer and including gallium;

a third type layer disposed on the second type layer and including gallium;

a first electrode electrically connected to the first type layer; and a second electrode electrically connected to the second type layer;

a plurality of light transparent insulators, each of which is disposed on a respective one of the second type layers of each of the plurality of light emitters; and a contiguous polymer layer disposed between adjacent light emitters of the plurality of light emitters, wherein the contiguous polymer layer has partially removed regions to expose an upper surface of each of the light emitters, the first electrode and the second electrode are disposed corresponding to the partially removed regions, and a top surface of each of the light transparent insulators is higher than a top surface of each respective one of the light emitters, each respective one of the light emitters being disposed between the support substrate and the corresponding light transparent insulator, a lowest surface of each of the light transparent insulators being higher than a bottom surface of the first type laver of each respective one of the light emitters.

9. The light emitting device of claim 8, wherein the contiguous polymer layer reflects light emitted from the light transparent insulators.

10. The light emitting device of claim 8, wherein a viewing angle of light reflected by the contiguous polymer layer is different from a viewing angle of light emitted from the light transparent insulators.

11. The light emitting device of claim 8, wherein the light emitters are positioned corresponding to the partially removed regions.

12. The light emitting device of claim 8, wherein each of the light transparent insulators are positioned in a region corresponding to each respective one of the partially removed regions.

13. The light emitting device of claim 8, wherein the light emitters are arranged in an n×m arrangement, in which n and m are natural numbers.

14. A light emitting device, comprising:

a support substrate;

a plurality of light emitters disposed on the support substrate, each of the light emitters including:

a first semiconductor layer; and a second semiconductor layer disposed on the first semiconductor layer;

a plurality of light transparent insulators, each of which is disposed on the second semiconductor layer of each respective one of the plurality of light emitters; and a contiguous polymer layer disposed between adjacent light emitters of the light emitters, wherein the contiguous polymer layer has partially removed regions to expose an upper surface of each of the light emitters, each of the light emitters are disposed in a region corresponding to each respective one of the partially removed regions, and a top surface of the each of the light transparent insulators is higher than a top surface of each respective one of the light emitters, each respective one of the light emitters being disposed between the support substrate and the corresponding light transparent insulator, a lowest surface of each of the light transparent insulators being higher than a bottom surface of the first type layer of each respective one of the light emitters.

15. The light emitting device of claim 14, wherein the contiguous polymer layer reflects light emitted from the light transparent insulators.

16. The light emitting device of claim 14, wherein a viewing angle of light reflected by the contiguous polymer layer is different from a viewing angle of light emitted from the light transparent insulators.

17. The light emitting device of claim 14, wherein the light transparent insulators are positioned in a region corresponding to each respective one of the partially removed regions.

18. The light emitting device of claim 14, wherein each of the light emitters further includes:

a first electrode electrically connected to the first semiconductor layer; and a second electrode electrically connected to the second semiconductor layer, the first electrode and the second electrode are positioned corresponding to the partially removed regions.

19. The light emitting device of claim 14, wherein the light emitters are arranged in an n×m arrangement, in which n and m are natural numbers.

* * * * *